(12) United States Patent
Takenaka et al.

(10) Patent No.: US 11,486,943 B2
(45) Date of Patent: Nov. 1, 2022

(54) MAGNETISM DETECTION DEVICE AND MAGNETISM DETECTION METHOD

(71) Applicant: YOKOGAWA ELECTRIC CORPORATION, Tokyo (JP)

(72) Inventors: Kazuma Takenaka, Tokyo (JP); Naoki Noguchi, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 37 days.

(21) Appl. No.: 17/218,869

(22) Filed: Mar. 31, 2021

(65) Prior Publication Data

US 2021/0302509 A1 Sep. 30, 2021

(30) Foreign Application Priority Data

Mar. 31, 2020 (JP) .............................. JP2020-063695

(51) Int. Cl.
  *G01R 33/028* (2006.01)
  *G01R 33/09* (2006.01)
  *G01D 5/14* (2006.01)

(52) U.S. Cl.
  CPC ......... *G01R 33/0283* (2013.01); *G01D 5/147* (2013.01); *G01R 33/091* (2013.01)

(58) Field of Classification Search
  CPC .. G01D 5/147; G01R 33/0283; G01R 33/063; G01R 33/091
  See application file for complete search history.

(56) References Cited

U.S. PATENT DOCUMENTS

| 2015/0211888 A1* | 7/2015 | Johnson .................. G01D 5/48 324/207.13 |
| 2018/0329001 A1* | 11/2018 | Tanigawa ............. G01R 33/063 |
| 2019/0257909 A1* | 8/2019 | Romero ................. G01D 5/142 |

FOREIGN PATENT DOCUMENTS

JP      H5-151535 A     6/1993

OTHER PUBLICATIONS

Kazuma Takenaka et al., "Distributed magnetic sensor using reflection coefficients from both ends of single magnetic coaxial cable", AIP Advances 10, 125028 (2020), pp. 1-4, Dec. 30, 2020.

* cited by examiner

*Primary Examiner* — Alvaro E Fortich
*Assistant Examiner* — Adam S Clarke
(74) *Attorney, Agent, or Firm* — Osha Bergman Watanabe & Burton LLP

(57) ABSTRACT

A magnetism detection device includes: a transmission line set having a transmission line including a linear first conductor including a magnetic material; and a detector that: inputs, from a first end of the transmission line set, a pulse signal as a first incident wave and detects, at the first end, a first reflected wave of the first incident wave; inputs, from a second end opposite to the first end, a pulse signal as a second incident wave and detects, at the second end, a second reflected wave of the second incident wave; and detects a strength of a magnetic field applied to the transmission line set based on compositing of the first reflected wave and the second reflected wave.

12 Claims, 21 Drawing Sheets

Bias current

Bias magnetic field

MAGNETISM DETECTION DEVICE AND MAGNETISM DETECTION METHOD

BACKGROUND

Technical Field

The present invention generally relates to a magnetism detection device and a magnetism detection method.

Related Art

A device for detecting a magnetic field is conventionally known.

For example, patent document 1 discloses a magnetic field detection device wherein a magnetic material is disposed within a distributed constant circuit. The magnetic permeability of this magnetic material changes when a magnetic field is imparted. The magnetic field detection device taught in patent document 1 generates a standing wave in the distributed constant circuit by exciting the distributed constant circuit using an oscillator and generating a traveling wave and a reflected wave. The magnetic field detection device taught in patent document 1 can detect change in electromagnetic field distribution in the distributed constant circuit and detect the magnetic field by detecting a voltage of the standing wave generated in the distributed constant circuit.

Patent Document

Patent Document 1: JP H5-151535 A

That being said, the traveling wave and reflected wave may be attenuated by propagating through the distributed constant circuit. When the traveling wave and the reflected wave are attenuated, the magnetic field detection device may not be able to accurately detect the magnetic field.

SUMMARY

One or more embodiments provide a magnetism detection device and magnetism detection method capable of accurately detecting a magnetic field.

A magnetism detection device according to one or more embodiments includes a detection device (i.e., detector) and a transmission line set having at least one transmission line including a linear first conductor including a magnetic material, and the detection device inputs a pulse signal as a first incident wave from a first end on one end of the transmission line set to detect a first reflected wave from the first end, inputs a pulse signal as a second incident wave from a second end on the other end of the transmission line set to detect a second reflected wave from the second end, and detects a strength of a magnetic field applied to the transmission line set based on a composite of the first reflected wave and the second reflected wave. By thus compositing the first reflected wave and the second reflected wave, the influence of noise when detecting the magnetic field may be reduced. By configuring as such, the detection device can accurately detect the magnetic field strength.

In the magnetism detection device according to one or more embodiments, the detection device may detect a position of the magnetic field applied to the transmission line set based on a time from a timepoint when the first incident wave is inputted to a timepoint when the first reflected wave is detected. By configuring as such, the detection device can simultaneously detect the strength of the magnetic field applied to the transmission line and the position at which the magnetic field is applied.

In the magnetism detection device according to one or more embodiments, the at least one transmission line further includes a dielectric and a second conductor and may be any of a coaxial cable, a parallel double line, a strip line, a microstrip line, a coplanar line, and a waveguide. Configuring the transmission line as a coaxial cable enables the transmission line to be flexible. Furthermore, configuring the parallel double line, strip line, microstrip line, coplanar line, and waveguide from a flexible substrate enables the transmission line to be flexible. Due to the transmission line being flexible, the degree of freedom of arrangement of the transmission line may increase.

In the magnetism detection device according to one or more embodiments, the magnetic material may be distributed substantially uniformly in the first conductor, or a magnetic film including the magnetic material may be formed on a conductor surface of the first conductor. By configuring as such, hysteresis may less readily occur in the first conductor. Due to hysteresis less readily occurring in the first conductor, the transmission line may detect the magnetic field at high sensitivity.

In the magnetism detection device according to one or more embodiments, the at least one transmission line may include a plurality of the first conductor. By configuring as such, overall resistance loss of the plurality of the first conductor may be reduced.

In the magnetism detection device according to one or more embodiments, the magnetism detection device may further include a coil on the at least one transmission line, the coil being capable of applying a bias magnetic field. By configuring as such, the magnetism detection device can determine not only the strength of the magnetic field applied to the transmission line, but also whether a positive magnetic field is applied or a negative magnetic field is applied.

In the magnetism detection device according to one or more embodiments, the detection device may acquire composite data and detect the strength of the magnetic field applied to the transmission line set based on the composite data by acquiring first voltage data indicating a voltage of the first reflected wave with respect to a first time, the first time being the time from a timepoint when the first incident wave is inputted to a timepoint when the first reflected wave is detected, acquiring second voltage data indicating a voltage of the second reflected wave with respect to a second time, the second time being the time from a timepoint when the second incident wave is inputted to a timepoint when the second reflected wave is detected, and inverting one of the first voltage data and the second voltage data, with a reference time, which is the time for the pulse signal to travel back and forth between a midpoint of the transmission line set and the detection device, being the axis of symmetry. By inverting one of the first voltage data and the second voltage data with respect to the reference time, it is possible to match a peak position of the voltage of the first voltage data and a peak position of the voltage of the second voltage data to each other.

In the magnetism detection device according to one or more embodiments, the detection device may detect the strength of the magnetic field applied to the transmission line set using a peak value of the composite data. By configuring as such, the detection device can accurately detect the magnetic field strength.

In the magnetism detection device according to one or more embodiments, the transmission line set includes one of the transmission line, the first end is located at one end of the one transmission line acting as one end on the transmission line set, the second end is located at the other end of the one transmission line acting as the other end on the transmission line set, and the detection device may: sweep a sinusoidal pulse signal as the first incident wave, input it to the first end, and detect the first reflected wave from the first end; acquire a reflectance and a phase difference of the first reflected wave with respect to the first incident wave for each frequency of the first incident wave that is swept and inputted, acquire frequency domain data of the first reflectance based on the acquired reflectance of the first reflected wave with respect to the first incident wave, and acquire frequency domain data of the first phase difference based on the acquired phase difference of the first reflected wave with respect to the first incident wave; acquire time domain data of the first reflected wave as the first voltage data by inverse Fourier transforming the frequency domain data of the first reflectance and the frequency domain data of the first phase difference; sweep a sinusoidal pulse signal as the second incident wave, input it to the second end, and detect the second reflected wave from the second end; acquire a reflectance and a phase difference of the second reflected wave with respect to the second incident wave for each frequency of the second incident wave that is swept and inputted, acquire frequency domain data of the second reflectance based on the acquired reflectance of the second reflected wave with respect to the second incident wave, and acquire frequency domain data of the second phase difference based on the acquired phase difference of the second reflected wave with respect to the second incident wave; and acquire time domain data of the second reflected wave as the second voltage data by inverse Fourier transforming the frequency domain data of the second reflectance and the frequency domain data of the second phase difference. By configuring as such, even when there is fluctuation in the incident wave, the detection device can cancel the fluctuation and detect the reflectance and phase difference of the reflected wave with respect to the incident wave. In other words, the detection device can remove jitter of the incident wave and can perform a synchronized measurement without fluctuation of the signal over time.

In the magnetism detection device according to one or more embodiments, the detection device may: inverse Fourier transform the frequency domain data of the first reflectance and the frequency domain data of the first phase difference to acquire the time domain data of the first reflected wave as an impulse response or integrate the inverse Fourier transformed frequency domain data of the first reflectance and frequency domain data of the first phase difference to acquire the time domain data of the first reflected wave as a step response; and inverse Fourier transform the frequency domain data of the second reflectance and the frequency domain data of the second phase difference to acquire the time domain data of the second reflected wave as an impulse response or integrate the inverse Fourier transformed frequency domain data of the second reflectance and frequency domain data of the second phase difference to acquire the time domain data of the second reflected wave as a step response. By acquiring the time domain data of the first reflected wave and the time domain data of the second reflected wave as an impulse response or a step response, the detection device can accurately detect the magnetic field strength.

In the magnetism detection device according to one or more embodiments, the transmission line set includes a first transmission line and a second transmission line as the at least one transmission line, the first transmission line and the second transmission line being disposed in parallel, the first end may be located at the end of the first transmission line on the side of one end of the transmission line set, and the second end may be located at the end of the second transmission line on the side of the other end of the transmission line set. Due to the transmission line set including the first transmission line and the second transmission line, the detection device can input the first incident wave to the first end of the first transmission line and the second incident wave to the second end of the second transmission line. By configuring as such, the time required for the detection device to detect the strength and position of the magnetic field may be shortened.

In the magnetism detection device according to one or more embodiments, the detection device may acquire the first voltage data by subtracting a first offset data detected when the magnetic field to be detected is not applied to the transmission line set from the data of the first reflected wave detected when the magnetic field to be detected is applied to the transmission line set and acquire the second voltage data by subtracting a second offset data detected when the magnetic field to be detected is not applied to the transmission line set from the data of the second reflected wave detected when the magnetic field to be detected is applied to the transmission line set. By using such first offset data and second offset data, the influence of reflected waves generated by factors other than the magnetic field to be detected being applied to the transmission line may be reduced.

The magnetism detection method according to one or more embodiments includes inputting a pulse signal as a first incident wave from a first end on one end of a transmission line set having at least one transmission line including a linear first conductor including a magnetic material to detect a first reflected wave from the first end, inputting a pulse signal as a second incident wave from a second end on the other end of the transmission line set to detect a second reflected wave from the second end, and detecting a strength of a magnetic field applied to the transmission line set based on a composite of the first reflected wave and the second reflected wave. By thus compositing the first reflected wave and the second reflected wave, the influence of noise when detecting the magnetic field may be reduced. By configuring as such, the detection device can accurately detect the magnetic field strength.

According to one or more embodiments, it is possible to provide a magnetism detection device and magnetism detection method capable of accurately measuring a magnetic field.

DETAILED DESCRIPTION

In one or more embodiments, "external magnetic field" means a magnetic field applied externally to the transmission line, which is not applied to the transmission line in an initial state. The external magnetic field may be generated by a magnet or the like.

In one or more embodiments, "environmental magnetic field" means a magnetic field applied to the transmission line from an initial state, being generated from geomagnetism, another electronic device, or the like. The environmental magnetic field may be noise when the magnetic field to be detected is an external magnetic field.

In one or more embodiments, "bias magnetic field" means a magnetic field applied to a sensor in advance by a coil or the like. The bias magnetic field can apply polarity to the sensor output and improve linearity.

In one or more embodiments, "magnetic field" is a generic term for magnetic fields, including external magnetic fields, environmental magnetic fields, and bias magnetic fields.

In one or more embodiments, "magnetic field at a prescribed (arbitrary) position" means a magnetic field at that position, including external magnetic fields, environmental magnetic fields, and bias magnetic fields.

In one or more embodiments, "axial direction" means a direction along a linear transmission line. In the present disclosure, "circumferential direction" means a direction around a linear transmission line.

Embodiments of the present invention will be described herein with reference to the drawings. Those skilled in the art will recognize that many alternative embodiments can be accomplished using the teaching of the present invention and that the present invention is not limited to the embodiments illustrated herein for explanatory purposes.

First Embodiment

Figure 1:
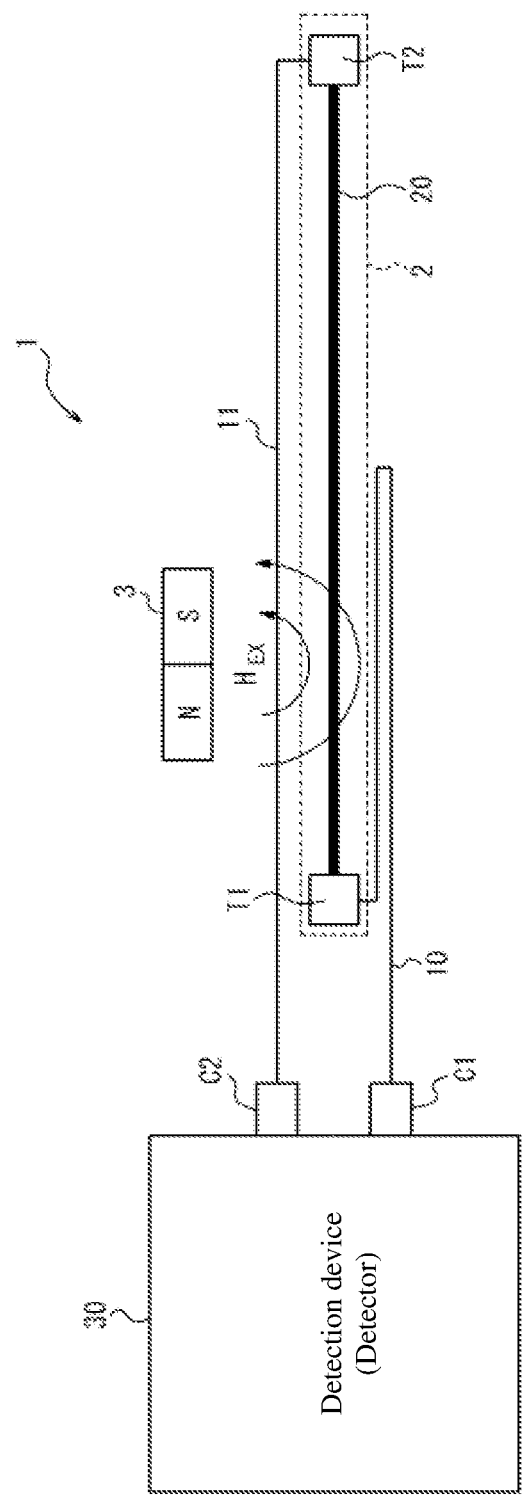
FIG. 1 is a diagram illustrating a schematic configuration of the magnetism detection device according to a first embodiment.

FIG. 1 is a diagram illustrating a schematic configuration of a magnetism detection device 1 according to a first embodiment. The magnetism detection device 1 include a transmission line set 2 and a detection device 30. In the first embodiment, the transmission line set 2 has one transmission line 20. The detection device 30 includes a connection end C1 and a connection end C2. The magnetism detection device 1 may further include a first conducting wire 10 and a second conducting wire 11.

In the magnetism detection device 1, a magnet 3 may apply an external magnetic field to the transmission line 20. In the configuration illustrated in FIG. 1, the external magnetic field applied to the transmission line 20 by the magnet 3 may be a magnetic field to be detected. However, the element applying the external magnetic field to the transmission line 20 is not limited to the magnet 3. For example, an external magnetic field from a Helmholtz coil, an external magnetic field due to leakage from a magnetic material, an external magnetic field generated by an eddy current, or the like may be applied to the transmission line 20. Even such an external magnetic field may be a magnetic field to be detected by the magnetism detection device 1. Furthermore, the magnetic field to be detected by the magnetism detection device 1 is not limited to an external magnetic field. For example, the magnetic field to be detected by the magnetism detection device 1 may be an environmental magnetic field due to geomagnetism or the like.

In the magnetism detection device 1, the detection device 30 inputs a pulse signal to the transmission line 20 as an incident wave. As is described later, the detection device 30 may detect the strength and position of the external magnetic field applied to the transmission line 20 by appropriately analyzing the pulse signal.

The first conducting wire 10 and the second conducting wire 11 are linear conductors. The first conducting wire 10 and the second conducting wire 11 may be non-magnetic conductors. The first conducting wire 10 connects the connection end C1 and a first end T1 of the transmission line 20. The second conducting wire 11 connects the connection end C2 and a second end T2 of the transmission line 20.

The length of the first conducting wire 10 and the length of the second conducting wire 11 are the same, a length A. However, the length of the first conducting wire 10 and the length of the second conducting wire 11 may differ. The length of the first conducting wire 10 and the length of the second conducting wire 11 may be suitably adjusted in consideration of the magnetic field distribution to be detected, the electrical characteristics of the transmission line 20, the rise time of the pulse signal inputted by the detection device 30 to the transmission line 20, and the like.

The transmission line 20 is a linear transmission line. The length of the transmission line 20 is a length B. The first end T1 is located at one end of the transmission line 20. The second end T2 is located at the other end of the transmission line 20. The first end T1 is connected to one end of the first conducting wire 10. The second end T2 is connected to one end of the second conducting wire 11. The first end T1 on the one end of the transmission line 20 is connected to the connection end C1 on the detection device 30 via the first conducting wire 10. The second end T2 on the other end of the transmission line 20 is connected to the connection end C2 on the detection device 30 via the second conducting wire 11. However, when the magnetism detection device 1 does not include the first conducting wire 10 and the second conducting wire 11, the first end T1 on the one end of the transmission line 20 may be directly connected to the connection end C1 on the detection device 30 without passing through the first conducting wire 10. Furthermore, the second end T2 on the other end of the transmission line 20 may be directly connected to the connection end C2 on the detection device 30 without passing through the second conducting wire 11.

The transmission line 20 has a prescribed characteristic impedance. The characteristic impedance is an impedance that does not depend on the length of the linear transmission line 20. The characteristic impedance may be determined according to the type, structure, and the like of the transmission line 20

Figure 2:
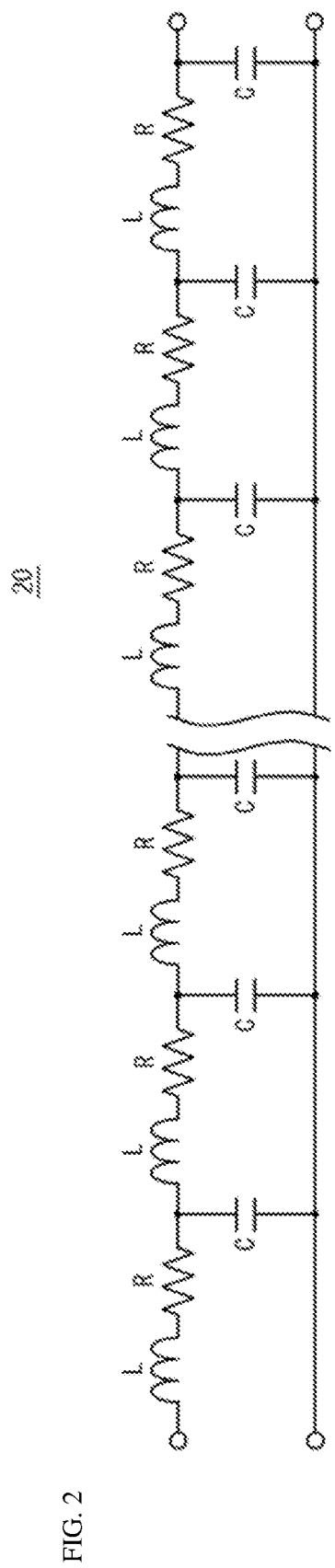
FIG. 2 is a diagram expressing the transmission line as a distributed constant circuit.
Figure 3:
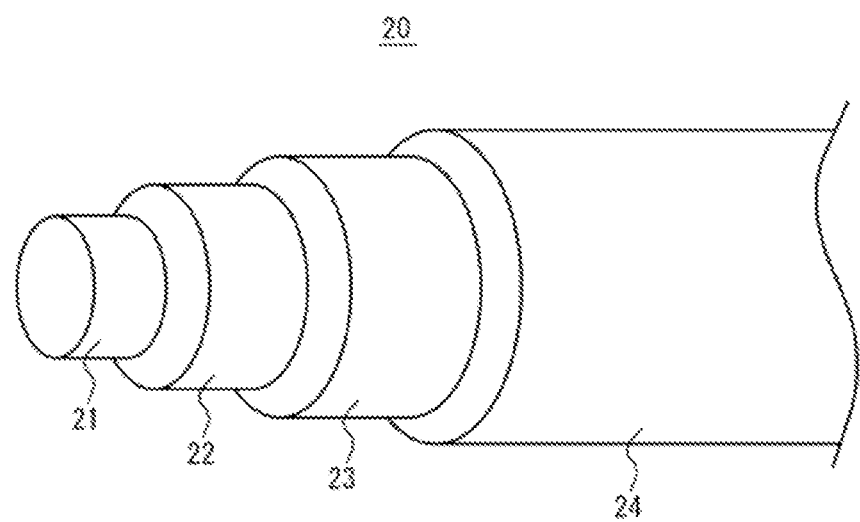
FIG. 3 is a diagram illustrating a schematic configuration of the transmission line configured as a coaxial cable.

The transmission line 20 can be represented as a distributed constant circuit such as illustrated in FIG. 2. In FIG. 2, a resistance component R is a resistance component per unit length in the axial direction of the transmission line 20. An inductance component L is an inductance component per unit length of the transmission line 20. A capacitance component C is a capacitance component per unit length of the transmission line 20. The capacitance component C may be a capacitance component between conductors included in the transmission line 20. Here, the distributed constant circuit such as illustrated in FIG. 2 may include a conductance component G per unit length of the transmission line 20. The conductance component G may be a conductance component between conductors included in the transmission line 20. The conductance component G may be minute depending on the structure of the transmission line 20. For example, when the structure of the transmission line 20 is a coaxial cable such as illustrated in FIG. 3 described later, the conductance component G may be minute. When the conductance component G is minute, as illustrated in FIG. 2, the conductance component may be omitted in the distributed constant circuit.

A characteristic impedance $Z_0$ of the transmission line 20 may be expressed by the following formula (1) when the transmission line 20 is expressed as a distributed constant circuit such as illustrated in FIG. 2.

[Equation 1]

$$Z_0 = \sqrt{\frac{R + j\omega L}{G + j\omega C}} \cong \sqrt{\frac{R + j\omega L}{j\omega C}} \quad (1)$$

In formula (1), an angular frequency $\omega$ is an angular frequency of high frequency current flowing through the transmission line 20. In formula (1), the conductance component G may be omitted, as described above.

The transmission line 20 may be configured as a coaxial cable, a flexible substrate (FPC: flexible printed circuits), or the like. However, the transmission line 20 may be configured in any structure insofar as it is a structure having characteristic impedance. Configuring the transmission line 20 as a coaxial cable or a flexible substrate enables the transmission line 20 to be flexible. Due to the transmission line 20 being flexible, the transmission line 20 may bend freely according to the location at which the transmission line 20 is disposed. By configuring as such, the degree of freedom of arrangement of the transmission line 20 may increase.

FIG. 3 illustrates a schematic configuration of the transmission line 20 configured as a coaxial cable. As illustrated in FIG. 3, the transmission line 20 includes a first conductor (signal wire) 21, a dielectric 22, a second conductor (shield wire) 23, and a covering 24.

When configuring the transmission line 20 as a coaxial cable, the resistance component R such as is shown in formula (1) and FIG. 2 is a resistance component per unit length of the first conductor 21. The inductance component L is an inductance component per unit length of the first conductor 21. The capacitance component C is a capacitance component per unit length between the first conductor 21 and the second conductor 23. The conductance component G is a conductance component corresponding to a leakage resistance per unit length between the first conductor 21 and the second conductor 23. Due to the leakage resistance being minute, the conductance component G is minute. When configuring the transmission line 20 as a coaxial cable, the conductance component G may be omitted in FIG. 2 and formula (1).

When a skin effect becomes significant in the first conductor 21 (skin depth $\delta \ll$ radius a of the first conductor 21), an impedance Z of the transmission line 20 is expressed by the following formula (2).

[Equation 2]

$$Z = \sqrt{\frac{\frac{a}{2\sqrt{2}\rho}R_{DC}(1+j)\sqrt{\omega\mu(H_{EX})}}{j\omega C}} \quad (2)$$

In formula (2), the angular frequency $\omega$ is the angular frequency of high frequency current flowing through the first conductor 21. The radius a is a radius of the first conductor 21. An electrical resistivity $\rho$ is an electrical resistivity of the first conductor 21. A resistance $R_{DC}$ is a direct current resistance of the first conductor 21. A magnetic permeability $\mu$ is a magnetic permeability of the first conductor 21 in the circumferential direction. A magnetic field strength $H_{EX}$ is a magnetic field strength of the external magnetic field applied to the transmission line 20.

The first conductor 21 is a linear conductor. The first conductor 21 is a conductor including a magnetic material. In the first conductor 21 such as shown in FIG. 3, the magnetic material included in the first conductor 21 is substantially uniformly distributed in the first conductor 21. However, the magnetic material included in the first conductor 21 may at least be present on the surface thereof. Due to the magnetic material being distributed substantially uniformly on the first conductor 21, hysteresis may occur less readily in the first conductor 21.

The first conductor 21 may be a conductor including a soft magnetic material. The soft magnetic material included in the first conductor 21 may have a low coercivity and a high magnetic permeability. For example, the first conductor 21 may include an amorphous alloy or permalloy.

Amorphous alloys and permalloy include magnetic materials having high magnetic permeability. Due to the first conductor 21 including an amorphous alloy or permalloy, in the transmission line 20 including the first conductor 21, the magnetic permeability in the circumferential direction and the magnetic permeability in the axial direction may increase. Due to the magnetic permeability in the circumferential direction and the magnetic permeability in the axial direction increasing, when the external magnetic field is applied to the transmission line 20, at least one effect of a magnetic impedance effect, described later, on the surface of the first conductor 21 and an effect of magnetization (domain wall displacement) within the first conductor 21 may increase. Due to at least one of these effects increasing, change in impedance, which is described later, in the transmission line 20 at the position where the external magnetic field is applied may be large.

For example, an amorphous alloy having irregularly arranged atoms may be an Fe—Co—Si—B alloy (Fe-rich), an Fe—Si—B—C alloy, an Fe—Si—B alloy, an Fe—Si—B—Nb—Cu alloy, an Fe—P—B alloy, or the like, which are Fe-based amorphous alloys. Furthermore, the amorphous alloy may be an Fe—Co—Si—B alloy (Co rich), a Co—Fe—Cr—Si—B alloy, or a Co—Fe—Mn—Cr—Si—B alloy, or the like, which are Co-based amorphous alloys. Moreover, the amorphous alloy may be a Ni-based amorphous alloy.

For example, the permalloy, which is an alloy mainly composed of Fe and Ni, may be a 78-permalloy having a Ni content of 78.5% (JIS standard: permalloy A), a 45-permalloy having a Ni content of 45% (40 to 50%) (JIS standard: permalloy B), a permalloy wherein Mo, Cu, Cr, or the like is added to 78-permalloy (JIS standard: permalloy C), or the like.

A volume resistivity of the permalloy is about 68 μΩcm. This volume resistivity is 40 times or greater than the volume resistivity of copper, 1.68 μΩcm.

The first conductor 21 may contain an Fe—Si—Al alloy (for example, sendust), an Fe—Co alloy (for example, permendur), a Mn—Zn alloy or Ni—Zn alloy (for example, soft ferrite), an Fe—Si alloy (for example, silicon steel or electrical steel), or the like as another soft magnetic material other than the amorphous alloy and the permalloy.

When the magnetic field applied to the transmission line 20 is a relatively strong magnetic field of about 10 [Oe (Oersted)], the first conductor 21 may include a single metal, such as Fe, Ni or Co, as the magnetic material.

The first conductor 21 may include a nanocrystal soft magnetic material in which nanocrystal grains are dispersed in an amorphous phase.

The dielectric 22 is cylindrical. The dielectric 22 covers the surface of the first conductor 21. The dielectric 22 may be, for example, an insulating material such as PTFE (polytetrafluoroethylene) or polyethylene.

The second conductor 23 is cylindrical. The second conductor 23 covers the surface of the dielectric 22. The second conductor 23 may be, for example, a braided wire composed of copper wire.

The covering 24 is cylindrical. The covering 24 covers the surface of the second conductor 23. The covering 24 houses the first conductor 21, the dielectric 22, and the second conductor 23 therein. The covering 24 protects the first conductor 21, the dielectric 22, and the second conductor 23 by housing them therein.

The first conductor 21, the dielectric 22, the second conductor 23, and the covering 24 may be composed of a flexible material. By configuring as such, the transmission line 20 may be flexible.

As illustrated in FIG. 1, when an external magnetic field having the magnetic field strength $H_{EX}$ is applied to the transmission line 20, the impedance of the transmission line 20 may change due to the magnetic impedance effect at the position where the external magnetic field is applied. For example, a high frequency current may flow into the first conductor 21 of the transmission line 20 by inputting a pulse signal from the detection device 30 described later. When a high-frequency current flows into the first conductor 21, the first conductor 21 is magnetized in one direction in the circumferential direction. Due to the first conductor 21 being magnetized in one direction in the circumferential direction, a magnetic moment may be induced in the circumferential direction of the first conductor 21. In this state, as illustrated in FIG. 1, when an external magnetic field of the magnetic field strength $H_{EX}$ is applied in the axial direction of the transmission line 20, a magnetic moment induced in the circumferential direction of the first conductor 21 rotates in the direction in which the external magnetic field of the magnetic field strength $H_{EX}$ is applied. This rotation of the magnetic moment changes the magnetic permeability of the first conductor 21 in the circumferential direction. The impedance of the transmission line 20 depends on the magnetic permeability of the first conductor 21 in the circumferential direction. Therefore, when the magnetic permeability in the circumferential direction of the first conductor 21 at the position where the external magnetic field is applied changes, the impedance of the transmission line 20 at the position where the external magnetic field is applied changes.

An impedance $Z_M$ of the transmission line 20, which changes due to the magnetic impedance effect, may be expressed by the following formula (3) when the skin effect on the first conductor 21 is significant (skin depth δ<<radius a of the first conductor 21).

[Equation 3]

$$Z_M = R + j\omega L \cong \frac{a}{2\sqrt{2}\rho} R_{DC}(1+j)\sqrt{\omega \mu (H_{EX})} \quad (3)$$

With reference to formula (3), it can be seen that when the magnetic permeability μ of the first conductor 21 in the circumferential direction changes, not only does the inductance component L change, but also the resistance component R. Furthermore, it can be seen that detecting the impedance $Z_M$ of the transmission line 20 enables detection of the magnetic field strength $H_{EX}$ of the external magnetic field, via formula (3).

Figure 4:
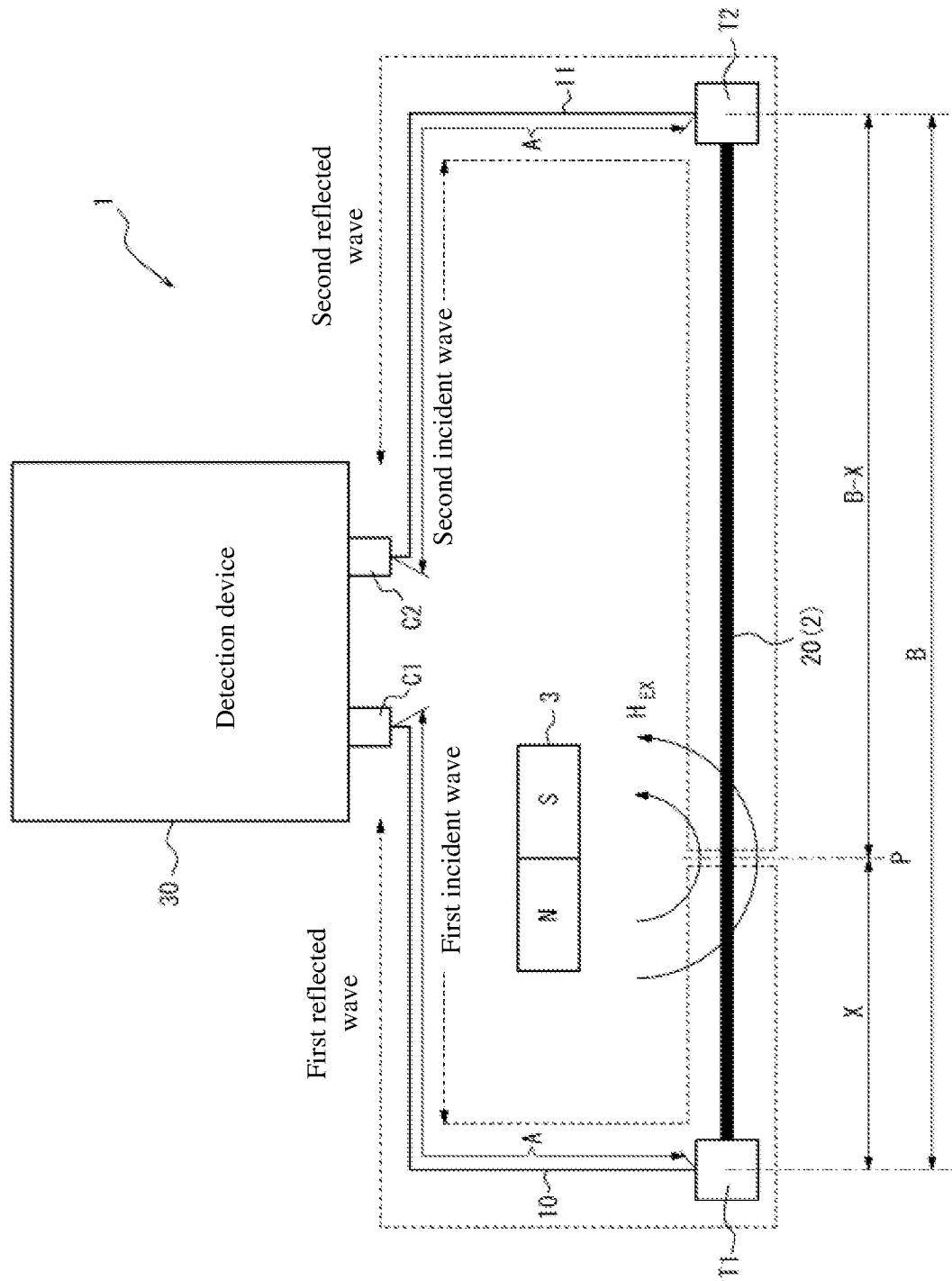
FIG. 4 is a diagram illustrating one example of an incident wave and a reflected wave in the configuration illustrated in FIG. 1.

FIG. 4 illustrates one example of an incident wave and a reflected wave in the configuration illustrated in FIG. 1. A position P is a position where the external magnetic field is applied to the transmission line 20 by the magnet 3. The distance between the position P and the first end T1 is a distance X.

The impedance of the transmission line 20 at the position P changes due to the magnetic impedance effect, as described above. An impedance mismatch in the transmission line 20 may occur at the position P. Due to an impedance mismatch in the transmission line 20 occurring at the position P, when the incident wave is incident on the position P, a reflected wave may be generated. A reflectance r of the reflected wave with respect to the incident wave at this time may be expressed by the following formula (4).

[Equation 4]

$$r = \frac{Z_M - Z_0}{Z_M + Z_0} = \frac{(Z_0 + \Delta Z) - Z_0}{(Z_0 + \Delta Z) + Z_0} = \frac{\Delta Z}{2Z_0 + \Delta Z} \quad (4)$$

In formula (4), the amount of change $\Delta Z$ is an amount of change in the impedance $Z_M$ from the impedance $Z_0$ ($\Delta Z = Z_M - Z_0$).

Furthermore, the relationship between a voltage $V_i$ of the incident wave and a voltage $V_R$ of the reflected wave at the position P may be expressed by the following formula (5).

[Equation 5]

$$V_R = rV_i = \frac{\Delta Z}{2Z_0 + \Delta Z} V_i \quad (5)$$

As described above with reference to formula (3), detecting the impedance $Z_M$ of the transmission line 20, which changes due to the magnetic impedance effect, enables detection of the magnetic field strength $H_{EX}$ of the external magnetic field. Furthermore, detecting the voltage $V_i$ of the incident wave and the voltage $V_R$ of the reflected wave at the position P enables detection of the amount of change $\Delta Z$ ($=Z_M-Z_0$) via formula (5). Moreover, the impedance $Z_0$ is known, as can be seen from formula (1). Because the impedance $Z_0$ is known, when the amount of change $\Delta Z$ is detected via formula (5) using the voltage $V_i$ of the incident wave and the voltage $V_R$ of the reflected wave, the magnetic field strength $H_{EX}$ of the external magnetic field can be detected via formula (3).

That is, the detection device 30 inputs the incident wave to the first end T1 of the transmission line 20 via the connection end C1. Due to the incident wave traveling to the position P, a reflected wave may be generated at the position P. At this time, the detection device 30 detects the voltage $V_i$ of the incident wave and the voltage $V_R$ of the reflected wave at the position P. Additionally, the detection device 30 detects the amount of change $\Delta Z$ via formula (5) using the detected incident wave voltage $V_i$ and reflected wave voltage $V_R$. Such a configuration enables calculation (detection) of the magnetic field strength $H_{EX}$ of the external magnetic field via formula (3).

That being said, the position P where the external magnetic field is applied, such as is illustrated in FIG. 4, may change according to the position of the magnet 3. Due to the position P changing according to the position of the magnet 3, it may become difficult for the detection device 30 to directly detect the voltage $V_i$ of the incident wave and the voltage $V_R$ of the reflected wave at the position P. Here, when the incident wave is inputted from the first end T1 of the transmission line 20, the reflected wave generated at the position P may travel in the direction opposite to the direction of travel of the incident wave and reach the first end T1. The detection device 30 can detect the voltage of the reflected wave that has reached the first end T1 of the transmission line 20 from the connection end C1. That is, instead of the voltage $V_R$ of the reflected wave at the position P, the detection device 30 can use the voltage of the reflected wave at the first end T1 of the transmission line 20. Furthermore, instead of the voltage $V_i$ of the incident wave at the position P, the detection device 30 can use the voltage of the incident wave at the first end T1 of the transmission line 20. Accordingly, the detection device 30 can detect the amount of change $\Delta Z$ via formula (5) using the voltage of the incident wave at the first end T1 of the transmission line 20 and the voltage of the reflected wave at the first end T1 of the transmission line 20.

Figure 12:
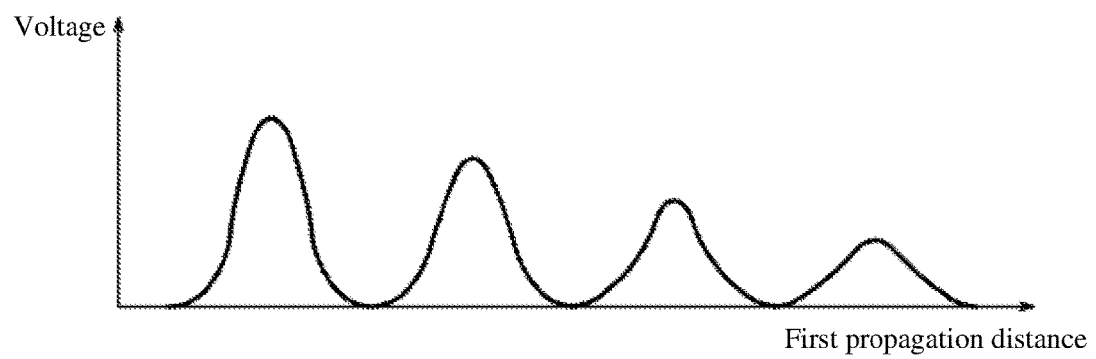
FIG. 12 is a diagram showing voltage data of the reflected wave with respect to propagation distance according to a comparative example.

Here, the incident wave inputted to the first end T1 of the transmission line 20 may propagate through the transmission line 20 to reach the position P. The incident wave may be attenuated due to resistance loss, dielectric loss, and the like of the transmission line 20 as it propagates through the transmission line 20. Therefore, the voltage of the incident wave at the position P may be smaller than the voltage of the incident wave at the first end T1 of the transmission line 20. Furthermore, the reflected wave generated at the position P may propagate through the transmission line 20 to reach the first end T1 of the transmission line 20. The reflected wave may be attenuated due to resistance loss, dielectric loss, and the like of the transmission line 20 as it propagates through the transmission line 20. Therefore, the voltage of the reflected wave when reaching the first end T1 of the transmission line 20 may be smaller than the voltage of the reflected wave at the position P. That is, the longer the propagation distance of the incident wave and the reflected wave propagating through the transmission line 20, the smaller the voltage of the reflected wave may be when reaching the first end T1, as illustrated in FIG. 12 described later. When the voltage of the reflected wave when reaching the first end T1 becomes small, the voltage of the reflected wave may be easily affected by noise. When the voltage of the reflected wave is easily affected by noise, the amount of change $\Delta Z$ may not be accurately detected via formula (5). As a result, it may be difficult to accurately detect the magnetic field strength $H_{EX}$ of the external magnetic field.

Also, in addition to inputting the first incident wave via the first end T1 of the transmission line 20 to acquire the first reflected wave, the detection device 30 also inputs the second incident wave via the second end T2 of the transmission line 20 to acquire the second reflected wave. Additionally, the detection device 30 composites the acquired first reflected wave and the acquired second reflected wave. The composited first reflected wave and second reflected wave may become less readily affected by noise, as described later with reference to FIG. 13. By configuring as such, the detection device 30 can accurately detect the magnetic field strength $H_{EX}$ of the external magnetic field.

<Detection Processing of Magnetic Field Strength>

As illustrated in FIG. 4, the detection device 30 may input a pulse signal as the first incident wave to the connection end C1. The pulse signal generated by the detection device 30 may be any shape. The pulse signal generated by the detection device 30 may be, for example, a rectangular wave shape, a sinusoidal shape, a triangular wave shape, a saw wave shape, or the like. The first incident wave inputted via the connection end C1 propagates through the first conducting wire 10 and is then inputted to the transmission line 20 via the first end T1. The first incident wave inputted via the first end T1 travels through the transmission line 20 in the direction from the first end T1 to the second end T2. When the first incident wave advances to a position where the impedance mismatch of the transmission line 20 occurs, for example, the position P, the first reflected wave may be generated at the position where the impedance mismatch occurs. The first reflected wave generated at the position where the impedance mismatch occurs travels through the transmission line 20 in the direction opposite to the direction of travel of the first incident wave, that is, in the direction from the second end T2 to the first end T1. The first reflected wave traveling in the direction opposite to the direction of travel of the first incident wave may reach the connecting end C1 via the first end T1 and the first conducting wire 10.

The detection device 30 may detect the first reflected wave via the connection end C1. Furthermore, the detection device 30 may acquire a first time. The first time is the time from a timepoint when the detection device 30 inputs the first incident wave to a timepoint when the detection device 30 detects the first reflected wave. The first time is the time for the pulse signal to travel back and forth between the connection end C1 and the position where the first reflected wave is generated.

The detection device 30 may input a pulse signal as the second incident wave to the connection end C2. The voltage of the pulse signal as the second incident wave may be the same as the voltage of the pulse signal as the first incident wave. The pulse signal inputted via the connection end C2 propagates through the second conducting wire 11 and is then inputted to the transmission line 20 via the second end T2. The second incident wave inputted via the second end T2 travels through the transmission line 20 in the direction from the second end T2 to the first end T1. When the second incident wave advances to a position where the impedance mismatch of the transmission line 20 occurs, for example, the position P, the second reflected wave may be generated at the position where the impedance mismatch occurs. The second reflected wave generated at the position where the impedance mismatch occurs travels through the transmission line 20 in the direction opposite to the direction of travel of the second incident wave, that is, in the direction from the first end T1 to the second end T2. The second reflected wave traveling in the direction opposite to the direction of travel of the second incident wave may reach the connecting end C2 via the second end T2 and the second conducting wire 11.

The detection device 30 may detect the second reflected wave via the connection end C2. Furthermore, the detection device 30 may acquire a second time. The second time is the time from a timepoint when the detection device 30 inputs the second incident wave to a timepoint when the detection device 30 detects the second reflected wave. The second time is the time for the pulse signal to travel back and forth between the connection end C2 and the position where the second reflected wave is generated.

Figure 5:
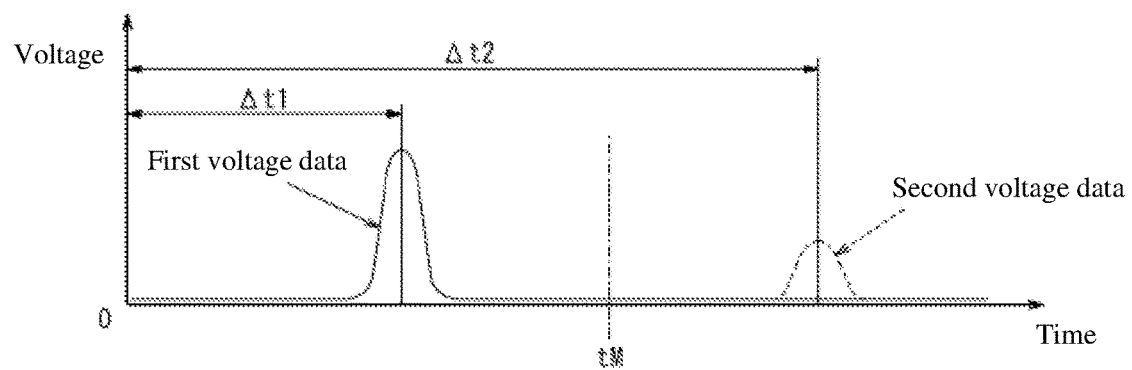
FIG. 5 is a diagram showing voltage data of the reflected wave with respect to time in the first embodiment.

Due to the detection device 30 detecting the first reflected wave and the second reflected wave, voltage data such as is shown in FIG. 5 can be obtained.

FIG. 5 shows voltage data of a reflected wave with respect to time. In FIG. 5, first voltage data indicating the voltage of the first reflected wave with respect to the first time and second voltage data indicating the voltage of the second reflected wave with respect to the second time are shown together. In FIG. 5, the first time and the second time are shown on the same time axis.

Figure 16:
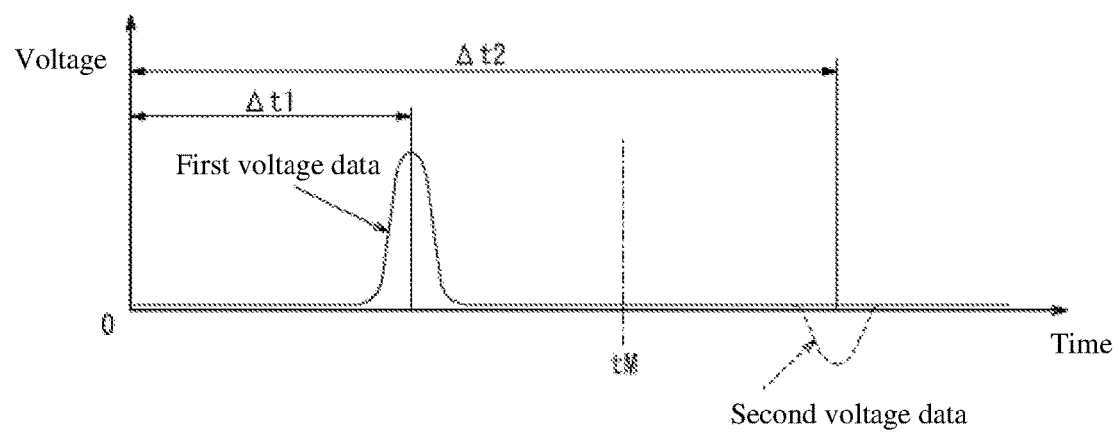
FIG. 16 is a diagram showing voltage data of the reflected wave with respect to time in the second embodiment.

In FIG. 5, they are not limited thereto, but positive pulse signals are used as the first incident wave and the second incident wave such as are illustrated in FIG. 4. Therefore, both the first reflected wave and the second reflected wave are positive pulse signals. When a negative pulse signal is used as the second incident wave, the second reflected wave becomes a negative pulse signal, as shown in FIG. 16 described later. Similarly, when a negative pulse signal is used as the first incident wave, the first reflected wave becomes a negative pulse signal.

The voltage of the first reflected wave peaks at the first time $\Delta t1$. The first time $\Delta t1$ may be the time for the pulse signal to travel back and forth between the connection end C1 and the position P. The voltage of the second reflected wave peaks at the second time $\Delta t2$. The second time $\Delta t2$ may be the time for the pulse signal to travel back and forth between the connection end C2 and the position P.

A reference time tM is the time for the pulse signal to travel back and forth between the connection end C1 or the connection end C2, that is, the detection device 30, and a midpoint of the transmission line 20. As described above, the length of the first conducting wire 10 and the length of the second conducting wire 11 are the same, the length A. Due to the length of the first conducting wire 10 and the length of the second conducting wire 11 being the same length A, the time for the pulse signal to travel back and forth between the connection end C1 and the midpoint of the transmission line 20 and the time for the pulse signal to travel back and forth between the connection end C2 and the midpoint of the transmission line 20 are the same. Therefore, when the position P is located at the midpoint of the transmission line 20, the first time $\Delta t1$ and the second time $\Delta t2$ are the same reference time tM.

In FIG. 5, a distance X between the position P and the first end T1 such as is illustrated in FIG. 4 is shorter than a distance (B−X) between the position P and the second end T2. Therefore, the distance that the first incident wave and the first reflected wave propagate through the transmission line 20 may be shorter than the distance that the second incident wave and the second reflected wave propagate through the transmission line 20. As a result, the attenuation of the first reflected wave is smaller than the attenuation of the second reflected wave. The peak value of the voltage of the first reflected wave is larger than the peak value of the voltage of the second reflected wave.

The detection device 30 detects the magnetic field strength $H_{EX}$ of the magnetic field applied to the transmission line 20 based on the compositing of the first reflected wave and the second reflected wave. A processing example for compositing the first reflected wave and the second reflected wave will be described.

Compositing Processing Example 1

The detection device 30 may composite the first reflected wave and the second reflected wave to acquire a composite value. The detection device 30 may composite the peak value of the first voltage data and the peak value of the second voltage data to acquire a composite value.

For example, when both the first incident wave and the second incident wave are positive pulse signals or negative pulse signals, the detection device 30 may add the peak value of the first voltage data and the peak value of the second voltage data to acquire the composite value.

For example, when the first incident wave is a positive pulse signal and the second incident wave is a negative pulse signal, the detection device 30 may subtract the peak value of the second voltage data from the peak value of the first voltage data to acquire the composite value.

For example, when the first incident wave is a negative pulse signal and the second incident wave is a positive pulse signal, the detection device 30 may subtract the peak value of the first voltage data from the peak value of the second voltage data to acquire the composite value.

The detection device 30 detects the magnetic field strength $H_{EX}$ of the magnetic field applied to the transmission line 20 based on the composite value. For example, the detection device 30 substitutes the composite value for $V_R$ in formula (5) and substitutes the voltage of the incident wave inputted via the connection end C1 and the connection end C2 for $V_i$ in formula (5). The detection device 30 detects the amount of change $\Delta Z$ by substituting these values in formula (5). The detection device 30 detects the magnetic field strength $H_{EX}$ applied to the transmission line 20 by substituting $(Z_0+\Delta Z)$ for $Z_M$ in formula (3). Here, the angular frequency ω in formula (3) may be the angular frequency when the pulse signal is approximated as a sine wave. The angular frequency ω will next be described in further detail. The waveform of the pulse signal can be approximated by a waveform having a duration of −T/2 to T/2 of the sine wave (T is the period of the sine wave). For example, when the height of the peak value of the voltage of the pulse signal is a voltage V, the waveform of the pulse signal is a sine wave of the voltage V/2 plus an offset of the voltage V/2. Therefore the rise time of the pulse signal is time $t_r \approx T/2 = 1/(2f)$. Also, the angular frequency of the pulse signal is angular frequency ω=2πf. Note, Approximating the waveform of the pulse signal as a sine wave is one example, and other waveforms may be used for approximation. Furthermore, when detecting the magnetic field strength $H_{EX}$, the detection device 30 may calculate (detect) the magnetic field strength $H_{EX}$ by using, instead of formula (3), an equation (for example, a linear approximation equation) approximating formula (3). Moreover, when detecting the magnetic field strength $H_{EX}$, the detection device 30 may calculate (detect) the magnetic field strength $H_{EX}$ by using, instead of formula (3), a previously acquired impedance $Z_M$ directly associated with the magnetic field strength $H_{EX}$.

Compositing Processing Example 2

The detection device 30 may composite the first voltage data and the second voltage data such as are shown in FIG. 5. The detection device 30 may composite the first voltage data and the second voltage data to acquire composite data. The compositing processing of the first voltage data and the second voltage is described below with reference to FIG. 6.

Figure 6:
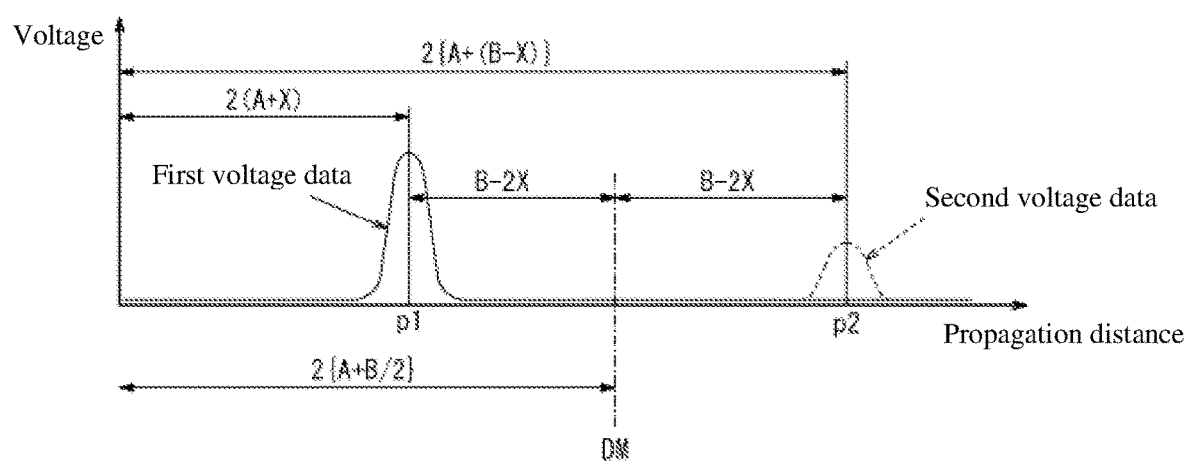
FIG. 6 is a diagram showing voltage data of the reflected wave with respect to propagation distance in the first embodiment.

FIG. 6 shows voltage data indicating a voltage of a reflected wave with respect to propagation distance. In FIG. 6, for ease of description, the time shown in FIG. 5 is converted into a propagation distance to which the pulse signal has propagated at that time. The first time is converted to a first distance. The first distance is the distance to which the pulse signal has propagated in the first time. The second time is converted to a second distance. The second distance is the distance to which the pulse signal has propagated in the second time.

For example, in FIG. 5, the first time Δt1 is the time for the pulse signal to travel back and forth between the connection end C1 and the position P. Therefore, the first time Δt1 is converted to the first distance p1 in FIG. 6. The first distance p1 is the distance that the pulse signal propagates when traveling back and forth between the connection end C1 and the position P. The first distance p1 is twice the distance (2(A+X)) between the connection end C1 and the position P.

For example, in FIG. 5, the second time Δt2 is the time for the pulse signal to travel back and forth between the connection end C2 and the position P. Therefore, the second time Δt2 is converted to the second distance p2 in FIG. 6. The second distance p2 is the distance that the pulse signal propagates when traveling back and forth between the connection end C2 and the position P. The second distance p2 is twice the distance (2(A+(B−X))) between the connection end C2 and the position P.

For example, in FIG. 5, the reference time tM is the time for the pulse signal to travel back and forth between the connection end C1 or the connection end C2, that is, the detection device 30, and a midpoint of the transmission line 20. Therefore, the reference time tM is converted to a reference distance DM in FIG. 6. The reference distance DM is the distance that the pulse signal propagates when traveling back and forth between the connection end C1 or the connection end C2, that is, the detection device 30, and a midpoint of the transmission line 20. The reference distance DM is a distance (2(A+B/2)).

That being said, when the position P is at the midpoint of the transmission line 20, the length of the first conducting wire 10 and the length of the second conducting wire 11 are the same length A, and thus the distance between the connection end C1 and the position P and the distance between the connection end C2 and the position P become equal. Therefore, when the position P is at the midpoint of the transmission line 20, the first distance p1 and the second distance p2 are located at the same reference distance DM on the axis of the propagation distance in the voltage data such as is shown in FIG. 6. Here, when the position P is shifted exactly a distance (B/2−X) toward the first end T1 from the midpoint of the transmission line 20, the distance between the connection end C1 and the position P is shorter than the reference distance DM by exactly a distance (2×(B/2−X)=B−2X). In this case, the first distance p1 is located at exactly a distance (B−2X) shorter than the reference distance DM on the axis of the propagation distance of the voltage data such as is shown in FIG. 6. Furthermore, when the position P is shifted exactly a distance (B/2−X) toward the first end T1 from the midpoint of the transmission line 20, the distance between the connection end C2 and the position P is longer than the reference distance DM by exactly a distance (2×(B/2−X)=B−2X). In this case, the second distance p2 is located at exactly the distance (B−2X) longer than the reference distance DM on the axis of the propagation distance of the voltage data such as is shown in FIG. 6. That is, regardless of the position of the position P, the difference between the reference distance DM and the first distance p1 (B−2X) and the difference between the second distance p2 and the reference distance DM (B−2X) may be equal on the axis of the propagation distance of the voltage data such as is shown in FIG. 6.

Figure 7:
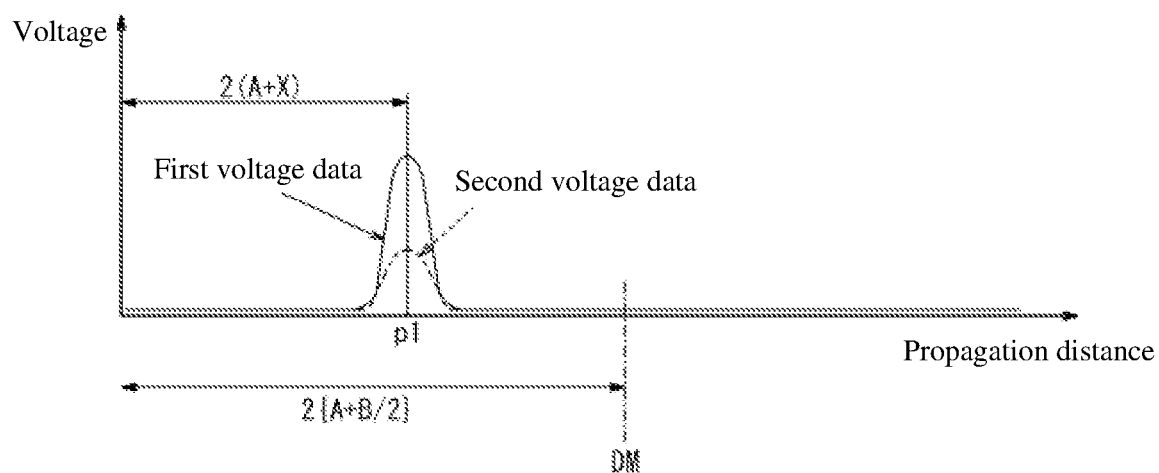
FIG. 7 is a diagram showing voltage data of the reflected wave with respect to propagation distance in the first embodiment.

Then, the detection device 30 inverts one of the first voltage data and the second voltage data, the reference distance DM being the axis of symmetry. For example, as shown in FIG. 7, the detection device 30 may invert the second voltage data, the reference distance DM being the axis of symmetry. The detection device 30 can invert one of the first voltage data and the second voltage data with the reference distance DM being the axis of symmetry to shift one of the position of the first distance p1 and the position of the second distance by a distance (2B−4X) on the axis of the propagation distance of the voltage data. In the example shown in FIG. 7, the detection device 30 can shift the position of the second distance p2 toward the first distance p1 by the distance (2B−4X) on the axis of the propagation distance. The detection device 30 can shift one of the position of the first distance p1 and the position of the second distance by the distance (2B−4X) on the axis of the propagation distance of the voltage data to match the position of the first distance p1 with the position of the second distance p2. That is, the detection device 30 can match a peak position of the voltage of the first voltage data and a peak position of the voltage of the second voltage data to each other on the axis of the propagation distance.

Figure 8:
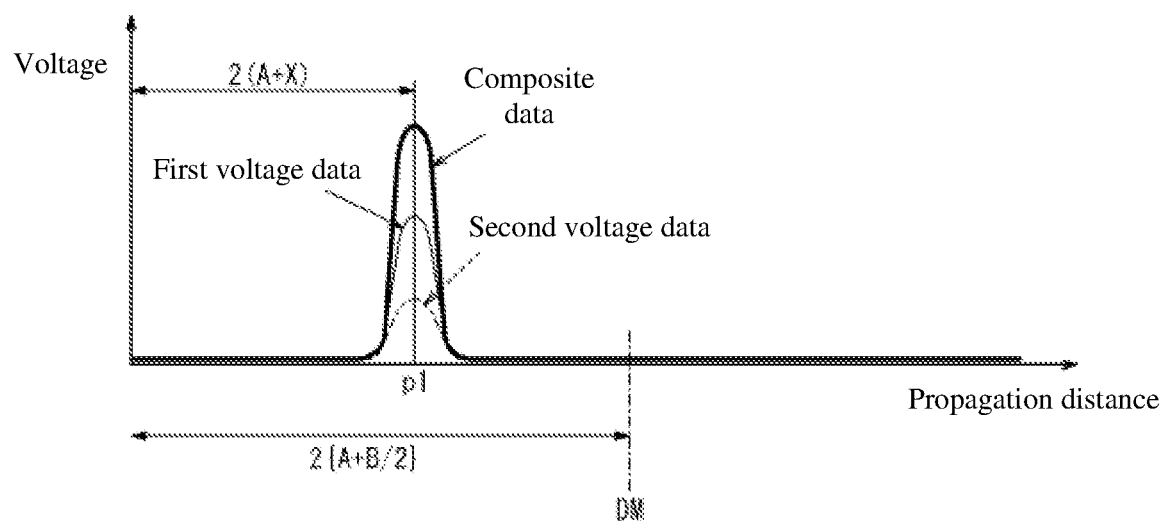
FIG. 8 is a diagram showing composite data of the reflected wave with respect to propagation distance in the first embodiment.

When one of the first voltage data and the second voltage data is inverted with the reference distance DM being the axis of symmetry, the detection device 30 composites the first voltage data and the second voltage data to acquire the composite data. For example, as shown in FIG. 8, the detection device 30 composites the first voltage data and the second voltage data to acquire the composite data.

For example, when both the first incident wave and the second incident wave are positive pulse signals or negative pulse signals, once one of the first voltage data and the second voltage data is inverted with the reference distance DM being the axis of symmetry, the detection device 30 may add the first voltage data and the second voltage data. The detection device 30 may add the first voltage data and the second voltage data to each other to acquire the composite data. In the example shown in FIG. 7, the detection device 30 adds the first voltage data and the second voltage data to acquire the composite data such as is shown in FIG. 8.

For example, when the first incident wave is a positive pulse signal and the second incident wave is a negative pulse signal, once one of the first voltage data and the second voltage data is inverted with the reference distance DM being the axis of symmetry, the detection device 30 may subtract the second voltage data from the first voltage data. The detection device 30 may subtract the second voltage data from the first voltage data to acquire the composite data.

For example, when the first incident wave is a negative pulse signal and the second incident wave is a positive pulse signal, once one of the first voltage data and the second voltage data is inverted with the reference distance DM being the axis of symmetry, the detection device 30 may subtract the first voltage data from the second voltage data. The detection device 30 may subtract the first voltage data from the second voltage data to acquire the composite data.

The detection device 30 detects the magnetic field strength $H_{EX}$ of the magnetic field applied to the transmission line 20 based on the composite data. For example, the detection device 30 may acquire the peak value of the voltage of the composite data such as is shown in FIG. 8 as the composite value. Similarly to compositing processing example 1, the detection device 30 may detect the magnetic field strength $H_{EX}$ of the magnetic field applied to the transmission line 20 based on the composite value.

Here, in compositing processing example 2, for ease of description, compositing of the first voltage data indicating the voltage of the first reflected wave with respect to the first time and the second voltage data indicating the voltage of the second reflected wave with respect to the second time is described using FIG. 6 to FIG. 8. Note, the first time and the first distance are interchangeable. Furthermore, the second time and the second distance are interchangeable. Accordingly, processing for the first voltage data indicating the voltage of the first reflected wave with respect to the first distance and the second voltage data indicating the voltage of the second reflected wave with respect to the second distance such as are shown in FIGS. 6 to 8 may be rephrased as processing for the first voltage data and the second voltage data such as are shown in FIG. 5. For example, processing for inverting one of the first voltage data and the second voltage data such as are shown in FIG. 6 with the reference distance DM being the axis of symmetry may be rephrased as processing for inverting one of the first voltage data and the second voltage data such as are shown in FIG. 5 with the reference time tM being the axis of symmetry. Furthermore, processing for compositing the first voltage data and the second voltage data on the axis of the propagation distance such as is shown in FIG. 8 may be rephrased as processing for compositing the first voltage data and the second voltage data on the time axis of the first time and the second time.

<Detection Processing of Magnetic Field Position>

The detection device 30 can use at least one of the first time and the second time to detect the position P at which the external magnetic field of the magnetic field strength $H_{EX}$ is applied. This processing will be described in detail below.

As described above, the first time Δt1 may be seen as the time for the pulse signal to travel back and forth between the connection end C1 and the position P. Here, a distance D1 from the connection end C1 to the position P is a value obtained by adding the distance X from the first end T1 to the position P to the length A of the first conducting wire 10 (that is, D1=A+X). The distance D1 from the connection end C1 to the position P may be expressed by formula (6).

[Equation 6]

$$D1 = A + X = \frac{\Delta t1a}{2}\alpha c + \frac{\Delta t1x}{2}\beta c \qquad (6)$$

In formula (6), the time Δt1a is the time for the pulse signal to travel back and forth in the first conducting wire 10 when traveling back and forth between the connection end C1 and the position P. The time Δt1x is the time for the pulse signal to travel back and forth between the first end T1 and the position P on the transmission line 20 when traveling back and forth between the connection end C1 and the position P. The fractional shortening α is wavelength fractional shortening in the first conducting wire 10 and in the second conducting wire 11. The fractional shortening β is wavelength fractional shortening in the transmission line 20. The speed c is the propagation speed of electromagnetic waves in a vacuum.

Here, the fractional shortening α is a value that depends on the members constituting the first conducting wire 10 and the second conducting wire 11, and is known. The fractional shortening β is a value that depends on the members constituting the transmission line 20 such as the dielectric 22, and is known. The speed c is the speed of light in a vacuum, 3.0×10$^8$ [m/s], and is known. The time Δt1a is known by measuring the time for the pulse signal to travel back and forth in the first conducting wire 10 in advance. The time Δt1x may be calculated by subtracting the time Δt1a from the first time Δt1 (that is, Δt1x=Δt1−Δt1a). In other words, the detection device 30 can calculate the time Δt1x by subtracting the time Δt1a from the first time Δt1 and substituting the calculated time Δt1x into formula (6) to calculate (detect) the position P at which the external magnetic field is applied, that is, the distance X.

The detection device 30 can apply the second time Δt2 to formula (6) instead of the first time Δt1 to calculate (detect) a distance D2 from the connection end C2 to the position P.

The distance D2 is a value obtained by adding the distance (B−X) from the second end T2 to the position P to the length A of the second conducting wire 11 (that is, D2=A+(B−X)). In this case, the detection device 30 substitutes the time Δt2a for the time Δt1a in formula (6). The time Δt2a is the time for the pulse signal to travel back and forth in the second conducting wire 11 when the pulse signal travels back and forth between the connection end C2 and the position P. The time Δt2a is known by measuring the time for the pulse signal to travel back and forth in the second conducting wire 11 in advance, similarly to the first conducting wire 10. The measured value of the time Δt1a may be used for the time Δt2a. Furthermore, the detection device 30 substitutes the time Δt2x for the time Δt1x in formula (6). The time Δt2x is time for the pulse signal to travel back and forth between the second end T2 and the position P on the transmission line 20 when the pulse signal travels back and forth between the connection end C2 and the position P. The time Δt2x may be calculated by subtracting the time Δt2a from the second time Δt2 (that is, Δt2x=Δt2−Δt2a). In other words, the detection device 30 can calculate the time Δt2x by subtracting the time Δt2a from the second time Δt2 and substitute the calculated time Δt2x into formula (6) to calculate (detect) the position P at which the external magnetic field is applied, that is, the distance X.

Thus, the detection device 30 can simultaneously detect the magnetic field strength $H_{EX}$ of the magnetic field applied to the transmission line 20 and the position P at which the external magnetic field is applied.

(Configuration Example of Detection Device)

Figure 20:
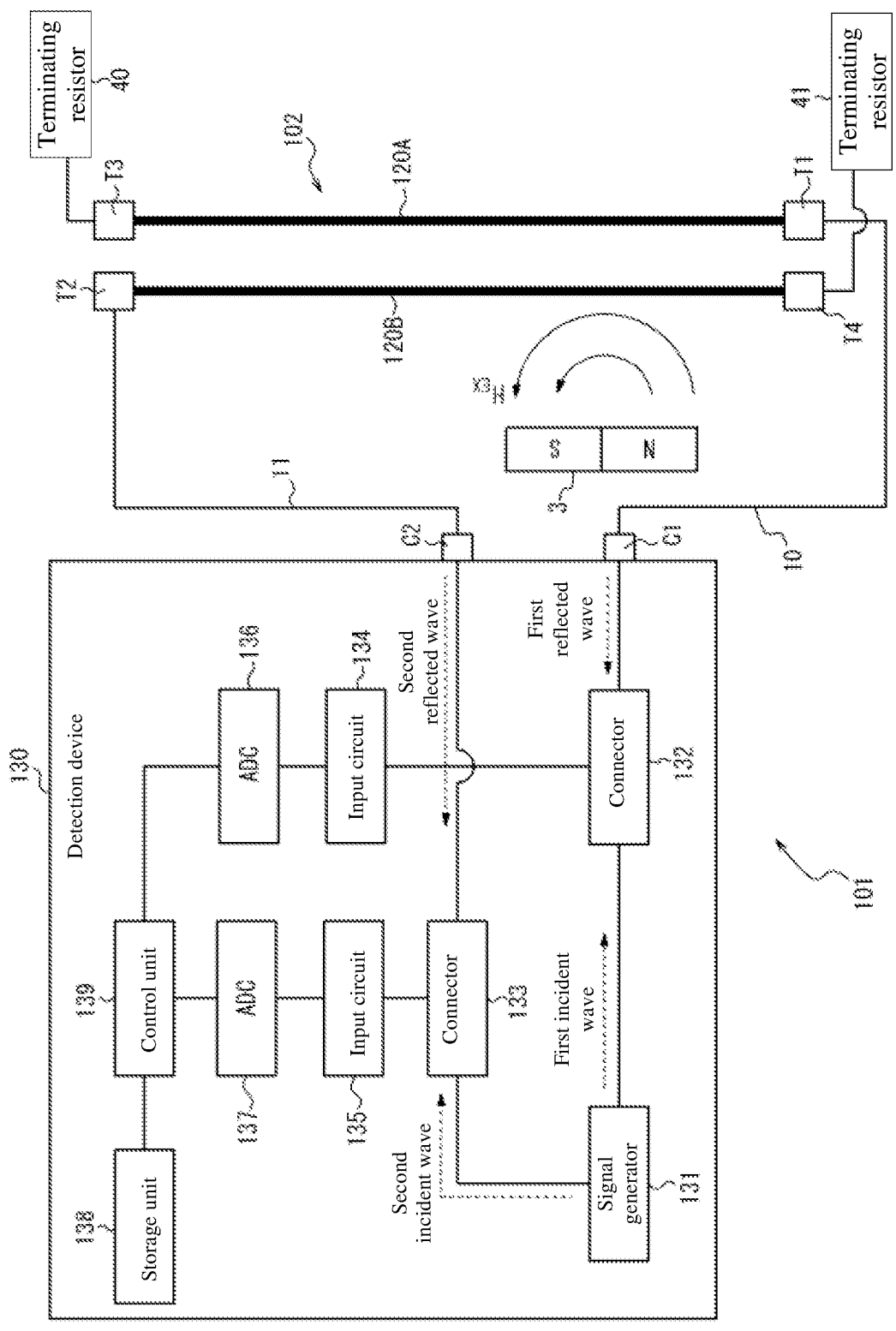
FIG. 20 is a block diagram illustrating a detailed configuration of the detection device illustrated in FIG. 14.

One example of a detailed configuration of the detection device 30 will be described with reference to FIG. 9. An example in which the detection device 30 is configured as a vector network analyzer will be described below. However, the configuration of the detection device 30 is not limited thereto. For example, the configuration of the detection device 30 may be as illustrated in FIG. 20 described later.

Figure 9:
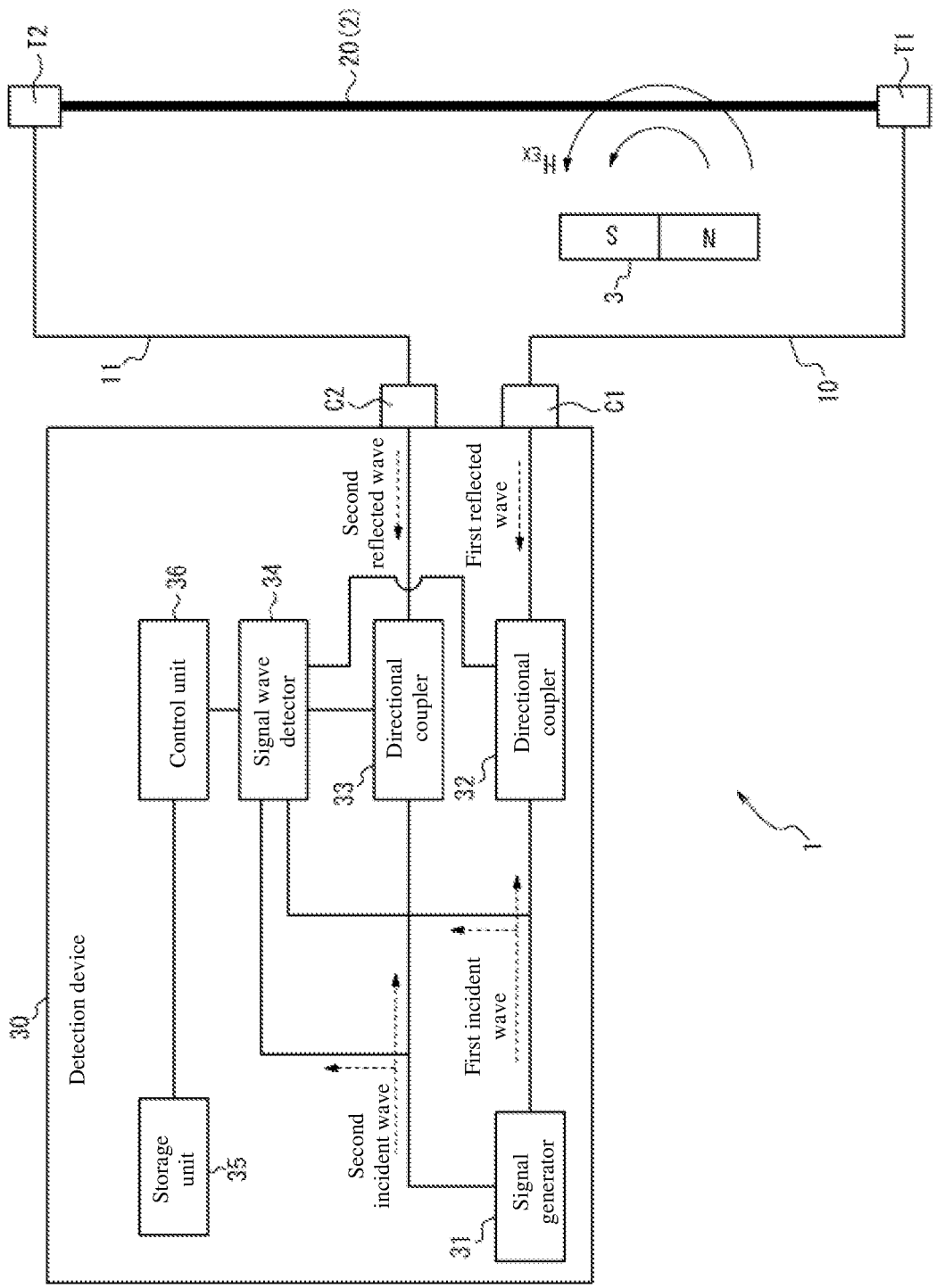
FIG. 9 is a block diagram illustrating a detailed configuration of the detection device illustrated in FIG. 1.

As illustrated in FIG. 9, the detection device 30 has a signal generator 31, a directional coupler 32, a directional coupler 33, a signal wave detector 34, a storage unit 35, and a control unit 36.

The signal generator 31 generates a sinusoidal pulse signal. In the present disclosure, "sinusoidal pulse signal" indicates one cycle of a sinusoidal waveform. That is, the "sinusoidal pulse signal" has both a positive portion and a negative portion of the sinusoidal waveform.

The signal generator 31 sweeps and outputs the sinusoidal pulse signal. In the present disclosure, "sweeps and outputs" means outputting while changing the frequency of the sinusoidal pulse signal. The signal generator 31 may output the sinusoidal pulse signal while continuously changing the frequency from a low frequency to a high frequency. For example, the signal generator 31 may output the sinusoidal pulse signal while changing the frequency of the sinusoidal pulse signal from 10 MHz to 50 GHz.

The signal generator 31 is connected to the directional coupler 32 and the signal wave detector 34. The sinusoidal pulse signal swept and outputted by the signal generator 31 is inputted to the directional coupler 32 and the signal wave detector 34 as the first incident wave.

The signal generator 31 is connected to the directional coupler 33 and the signal wave detector 34. The sinusoidal pulse signal swept and outputted by the signal generator 31 is inputted to the directional coupler 33 and the signal wave detector 34 as the second incident wave.

The voltage amplitude of the sinusoidal pulse signal swept and outputted by the signal generator 31 as the first incident wave may be constant with respect to frequency. The voltage amplitude of the sinusoidal pulse signal swept and outputted by the signal generator 31 as the second incident wave may be constant with respect to frequency. The voltage amplitude of the pulse signal as the first incident wave and the voltage amplitude of the pulse signal as the second incident wave may be the same.

The directional coupler 32 connects the connection end C1, the signal generator 31, and the signal wave detector 34 to each other. The first incident wave from the signal generator 31 is inputted to the first end T1 of the transmission line 20 via the directional coupler 32, the connection end C1, and the first conducting wire 10. The first reflected wave from the first end T1 of the transmission line 20 is inputted to the signal wave detector 34 via the first conducting wire 10, the connection end C1, and the directional coupler 32.

The directional coupler 33 connects the connection end C2, the signal generator 31, and the signal wave detector 34 to each other. The second incident wave from the signal generator 31 is inputted to the second end T2 of the transmission line 20 via the directional coupler 33, the connection end C2, and the second conducting wire 11. The second reflected wave from the second end T2 of the transmission line 20 is inputted to the signal wave detector 34 via the second conducting wire 11, the connection end C2, and the directional coupler 33.

The signal wave detector 34 detects the first incident wave inputted via the signal generator 31 and the first reflected wave inputted via the directional coupler 32. The signal wave detector 34 may detect a vector ratio of the first reflected wave with respect to the first incident wave for each frequency of the sinusoidal pulse signal swept and outputted by the signal generator 31. In the present disclosure, "vector ratio" is a vector defined by the reflectance and phase difference of the reflected wave with respect to the incident wave. Here, the reflectance of the reflected wave with respect to the incident wave may be the voltage amplitude of the reflected wave divided by the voltage amplitude of the incident wave. Furthermore, the phase difference of the reflected wave with respect to the incident wave may be obtained by subtracting the phase of the incident wave from the phase of the reflected wave.

The signal wave detector 34 detects the second incident wave inputted via the signal generator 31 and the second reflected wave inputted via the directional coupler 33. The signal wave detector 34 may detect a vector ratio of the second reflected wave with respect to the second incident wave for each frequency of the sinusoidal pulse signal swept and outputted by the signal generator 31.

Thus, the signal wave detector 34 can detect the reflectance and the phase difference of the reflected waves with respect to the incident waves as relative values. By configuring as such, even when there is fluctuation in the incident wave, the signal wave detector 34 can cancel the fluctuation and detect the reflectance and phase difference of the reflected wave with respect to the incident wave. In other words, the signal wave detector 34 can remove jitter of the incident wave and can perform a synchronized measurement without fluctuation of the signal over time.

The signal wave detector 34 may be configured including a filter having a variable pass band (for example, a bandpass filter or an IF (intermediate frequency) filter). When the filter is a bandpass filter, the pass band of the bandpass filter may be controlled according to a command from the control unit 36. The control unit 36 controls the pass band of the bandpass filter so as to pass the sinusoidal pulse signal outputted by the signal generator 31 and attenuate the signals of other frequencies. By configuring as such, among the noise included in the reflected wave, the bandpass filter included in the signal wave detector 34 can attenuate noise in frequency bands other than the frequency of the sinusoidal pulse signal outputted by the signal generator 31. Accordingly, the signal wave detector 34 can improve an SN ratio of the reflected wave received by the detection device 30.

Note, it is not essential that the signal wave detector 34 include a bandpass filter. The signal wave detector 34 does not have to include a bandpass filter.

The signal wave detector 34 may detect the incident wave and the reflected wave in the state of an analog signal. The signal wave detector 34 may detect the incident wave and the reflected wave in the state of a digital signal.

The storage unit 35 is, for example, a semiconductor memory, a magnetic memory, an optical memory, or the like, but is not limited thereto. The storage unit 35 may function as, for example, a main storage device, an auxiliary storage device, or a cache memory. The storage unit 35 stores data used for operation of the detection device 30 and data obtained by the operation of the detection device 30.

The control unit 36 includes at least one processor, at least one dedicated circuit, or a combination thereof. The processor is a general-purpose processor such as a CPU (central processing unit) or a GPU (graphics processing unit) or a dedicated processor specialized for specific processing. The dedicated circuit is, for example, an FPGA (field-programmable gate array) or an ASIC (application specific integrated circuit). The control unit 36 executes processing related to the operation of the detection device 30 while controlling each unit of the detection device 30.

The control unit 36 controls the signal generator 31 to cause the signal generator 31 to sweep and output the sinusoidal pulse signal as the first incident wave. Due to the signal generator 31 sweeping and outputting the sinusoidal pulse signal as the first incident wave, the first incident wave is inputted to the control unit 36 via the signal wave detector 34. Furthermore, the first reflected wave is inputted to the control unit 36 via the directional coupler 32 and the signal wave detector 34.

The control unit 36 acquires from the signal wave detector 34 the reflectance and phase difference of the first reflected wave with respect to the first incident wave for each frequency of the first incident wave. The control unit 36 acquires frequency domain data of the reflectance based on the reflectance of the first reflected wave with respect to the first incident wave. Hereinafter, the frequency domain data of the reflectance acquired based on the reflectance of the first reflected wave with respect to the first incident wave is also described as "frequency domain data of the first reflectance". The control unit 36 acquires frequency domain data of the phase difference based on the phase difference of the first reflected wave with respect to the first incident wave. Hereinafter, the frequency domain data of the phase difference acquired based on the phase difference of the first reflected wave with respect to the first incident wave is also described as "frequency domain data of the first phase difference". The control unit 36 inverse Fourier transforms the frequency domain data of the first reflectance and the frequency domain data of the first phase difference to acquire time domain data of the first reflected wave. This time domain data of the first reflected wave may correspond to the first voltage data indicating the voltage of the first reflected wave with respect to the first time such as is shown in FIG. 5.

The control unit 36 controls the signal generator 31 to cause the signal generator 31 to sweep and output the sinusoidal pulse signal as the second incident wave. Due to the signal generator 31 sweeping and outputting the sinusoidal pulse signal as the second incident wave, the second incident wave is inputted to the control unit 36 via the signal wave detector 34. Furthermore, the second reflected wave is inputted to the control unit 36 via the directional coupler 33 and the signal wave detector 34.

The control unit 36 acquires from the signal wave detector 34 the reflectance and phase difference of the second reflected wave with respect to the second incident wave for each frequency of the second incident wave. The control unit 36 acquires frequency domain data of the reflectance based on the reflectance of the second reflected wave with respect to the second incident wave. Hereinafter, the frequency domain data of the reflectance acquired based on the reflectance of the second reflected wave with respect to the second incident wave is also described as "frequency domain data of the second reflectance". The control unit 36 acquires frequency domain data of the phase difference based on the phase difference of the second reflected wave with respect to the second incident wave. Hereinafter, the frequency domain data of the phase difference acquired based on the phase difference of the second reflected wave with respect to the second incident wave is also described as "frequency domain data of the second phase difference". The control unit 36 inverse Fourier transforms the frequency domain data of the second reflectance and the frequency domain data of the second phase difference to acquire time domain data of the second reflected wave. The time domain data of the second reflected wave may correspond to the second voltage data indicating the voltage of the second reflected wave with respect to the second time such as is shown in FIG. 5.

The control unit 36 uses the time domain data of the first reflected wave as the first voltage data and uses the time domain data of the second reflected wave as the second voltage data to, as described above, detect the strength and position of the magnetic field applied to the transmission line 20.

The control unit 36 may use first offset data and second offset data when detecting the strength and position of the magnetic field applied to the transmission line 20. The first offset data is data of the first reflected wave detected when the magnetic field to be detected is not applied to the transmission line 20. The second offset data is data of the second reflected wave detected when the magnetic field to be detected is not applied to the transmission line 20.

The control unit 36 may subtract the first offset data from first raw data to acquire the first voltage data for detecting the strength and position of the magnetic field to be detected. The first raw data is data of the first reflected wave detected when the magnetic field to be detected is applied to the transmission line 20. The control unit 36 may use the frequency domain data of the first reflectance and the frequency domain data of the first phase difference detected when the magnetic field to be detected is applied to the transmission line 20 as the first raw data. In this case, the control unit 36 may store the frequency domain data of the first reflectance and the frequency domain data of the first phase difference detected when the magnetic field to be detected is not applied to the transmission line 20 to the storage unit 35 as the first offset data. Furthermore, the control unit 36 may use the time domain data of the first reflected wave detected when the magnetic field to be detected is applied to the transmission line 20 as the first raw data. In this case, the control unit 36 may store the time domain data of the first reflected wave detected when the magnetic field to be detected is not applied to the transmission line 20 to the storage unit 35 as the first offset data.

The control unit 36 may subtract the second offset data from second raw data to acquire the second voltage data for detecting the strength and position of the magnetic field to be detected. The second raw data is data of the second reflected wave detected when the magnetic field to be detected is applied to the transmission line 20. The control unit 36 may use the frequency domain data of the second reflectance and the frequency domain data of the second phase difference detected when the magnetic field to be detected is applied to the transmission line 20 as the second raw data. In this case, the control unit 36 may store the frequency domain data of the second reflectance and the frequency domain data of the second phase difference detected when the magnetic field to be detected is not applied to the transmission line 20 to the storage unit 35 as the second offset data. Furthermore, the control unit 36 may use the time domain data of the second reflected wave detected when the magnetic field to be detected is applied to the transmission line 20 as the second raw data. In this case, the control unit 36 may store the time domain data of the second reflected wave detected when the magnetic field to be detected is not applied to the transmission line 20 to the storage unit 35 as the second offset data.

By using such first offset data and second offset data, the influence of reflected waves generated by factors other than the magnetic field to be detected being applied to the transmission line 20 may be reduced. Other factors include, for example, mechanical tolerance of constituent elements of the transmission line 20, distortion caused by bending or the like of the transmission line 20, the environmental magnetic field applied from an initial state, impedance mismatch between transmission lines (for example, 50Ω coaxial cable and transmission line 20), and the like. The environmental magnetic field applied from the initial state is, for example, a magnetic field generated via geomagnetism, an electronic device, or the like.

(Operation Example of Magnetism Detection Device)

Figure 10:
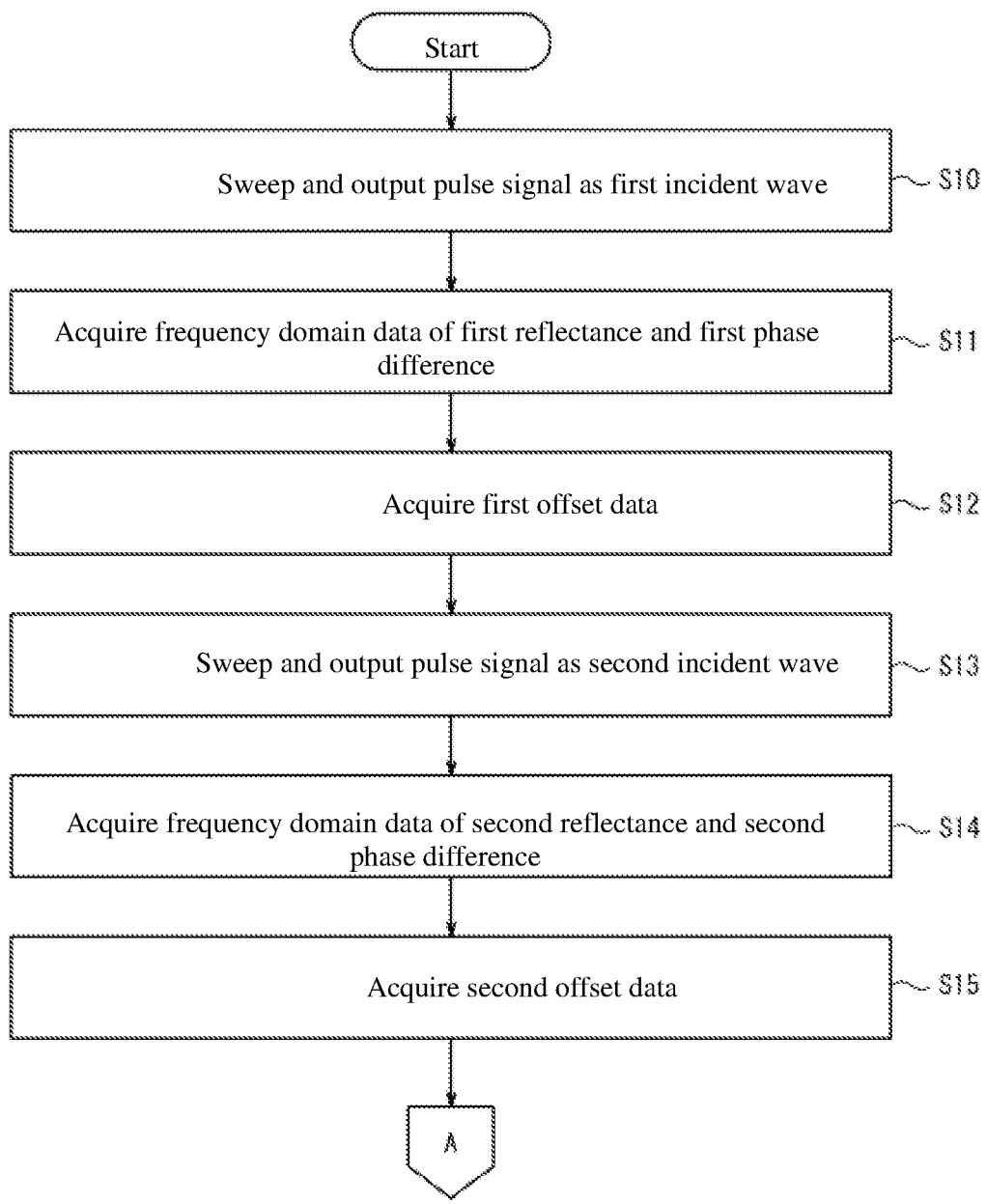
FIG. 10 is a flowchart showing one example of operation of the magnetism detection device according to the first embodiment.
Figure 11:
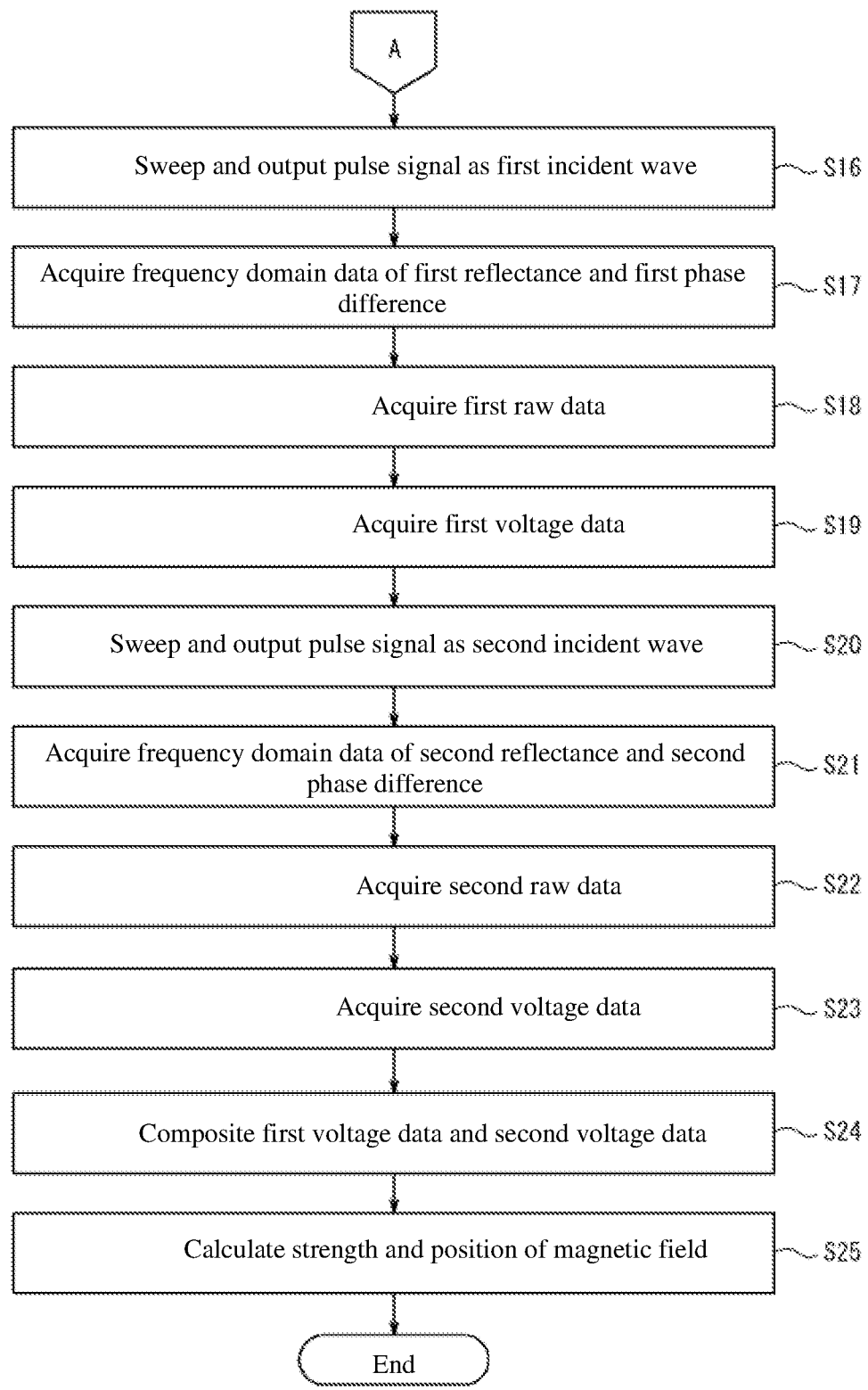
FIG. 11 is a flowchart showing one example of operation of the magnetism detection device according to the first embodiment.

Hereinafter, one example of operation of the magnetism detection device 1 will be described with reference to FIG. 10 and FIG. 11. Hereinafter, the magnetic field to be detected is the external magnetic field applied to the transmission line. Furthermore, no external magnetic field is applied to the transmission line 20 when the control unit 36 executes the processing shown in FIG. 10.

The control unit 36 controls the signal generator 31 to cause the signal generator 31 to sweep and output the sinusoidal pulse signal as the first incident wave when the external magnetic field is not applied to the transmission line 20 (step S10). The voltage amplitude of the sinusoidal pulse signal swept and outputted by the signal generator 31 as the first incident wave may be constant with respect to frequency.

The control unit 36 acquires the frequency domain data of the first reflectance and the frequency domain data of the first phase difference using the first incident wave inputted via the signal wave detector 34 and the first reflected wave inputted via the directional coupler 32 and the signal wave detector 34 (step S11).

The control unit 36 inverse Fourier transforms the frequency domain data of the first reflectance and the frequency domain data of the first phase difference acquired in the processing of step S11 to transform into time domain data of the first reflected wave (step S12). In the processing of step S12, the control unit 36 acquires this time domain data of the first reflected wave as the first offset data and stores it in the storage unit 35. When the voltage amplitude of the pulse signal outputted by the signal generator 31 in the processing of step S10 is constant with respect to frequency, the time domain data of the first reflected wave may be an impulse response to the first incident wave as an impulse signal.

The control unit 36 controls the signal generator 31 to cause the signal generator 31 to sweep and output the sinusoidal pulse signal as the second incident wave when the external magnetic field is not applied to the transmission line 20 (step S13). The voltage amplitude of the sinusoidal pulse signal swept and outputted by the signal generator 31 as the second incident wave may be constant with respect to frequency.

The control unit 36 acquires the frequency domain data of the second reflectance and the frequency domain data of the second phase difference using the second incident wave inputted via the signal wave detector 34 and the second reflected wave inputted via the directional coupler 33 and the signal wave detector 34 (step S14).

The control unit 36 inverse Fourier transforms the frequency domain data of the second reflectance and the frequency domain data of the second phase difference acquired in the processing of step S14 to transform into time domain data of the second reflected wave (step S15). In the processing of step S15, the control unit 36 acquires this time domain data of the second reflected wave as the second offset data and stores it in the storage unit 35. When the voltage amplitude of the pulse signal outputted by the signal generator 31 in the processing of step S13 is constant with respect to frequency, the time domain data of the second reflected wave may be an impulse response to the second incident wave as an impulse signal.

After the processing of step S15 is executed, the external magnetic field is applied to the transmission line 20. The detection device 30 proceeds to processing such as is illustrated in FIG. 11.

The control unit 36 controls the signal generator 31 to cause the signal generator 31 to sweep and output the sinusoidal pulse signal as the first incident wave when the external magnetic field is applied to the transmission line 20 (step S16). The waveform of the first incident wave outputted by the signal generator 31 in the processing of step S16 is the same as the waveform of the first incident wave outputted by the signal generator 31 in the processing of step S10.

The control unit 36 acquires the frequency domain data of the first reflectance and the frequency domain data of the first phase difference using the first incident wave inputted via the signal wave detector 34 and the first reflected wave inputted via the directional coupler 32 and the signal wave detector 34 (step S17).

The control unit 36 inverse Fourier transforms the frequency domain data of the first reflectance and the frequency domain data of the first phase difference acquired in the processing of step S17 to transform into time domain data of the first reflected wave (step S18). In the processing of step S18, the control unit 36 acquires this time domain data of the first reflected wave as the first raw data.

The control unit 36 acquires the first voltage data by subtracting the first offset data acquired in the processing of step S12 from the first raw data acquired in the processing of step S18 (step S19).

The control unit 36 controls the signal generator 31 to cause the signal generator 31 to sweep and output the sinusoidal pulse signal as the second incident wave when the external magnetic field is applied to the transmission line 20

(step S20). The waveform of the second incident wave outputted by the signal generator 31 in the processing of step S20 is the same as the waveform of the second incident wave outputted by the signal generator 31 in the processing of step S13.

The control unit 36 acquires the frequency domain data of the second reflectance and the frequency domain data of the second phase difference using the second incident wave inputted via the signal wave detector 34 and the second reflected wave inputted via the directional coupler 33 and the signal wave detector 34 (step S21).

The control unit 36 inverse Fourier transforms the frequency domain data of the second reflectance and the frequency domain data of the second phase difference acquired in the processing of step S21 to transform into time domain data of the second reflected wave (step S22). In the processing of step S22, the control unit 36 acquires this time domain data of the second reflected wave as the second raw data.

The control unit 36 acquires the second voltage data by subtracting the second offset data acquired in the processing of step S15 from the second raw data acquired in the processing of step S22 (step S23).

The control unit 36 composites the first voltage data acquired in the processing of step S19 and the second voltage data acquired in the processing of step S23 to generate composite data (step S24).

The control unit 36 detects the strength of the magnetic field applied to the transmission line 20 based on the composite data acquired in the processing of step S24 (step S25). In the processing of step S25, the control unit 36 detects the position of the magnetic field applied to the transmission line 20 based on at least one of the first time and the second time.

Note, in the processing of step S12, the control unit 36 may acquire the frequency domain data of the first reflectance and the frequency domain data of the first phase difference acquired in the processing of step S11 as the first offset data and store them in the storage unit 35. In this case, in the processing of step S18, the control unit 36 may acquire the frequency domain data of the first reflectance and the frequency domain data of the first phase difference acquired in the processing of step S17 as the first raw data. In the processing of step S19, the control unit 36 may subtract the inverse Fourier transformed first offset data from the inverse Fourier transformed first raw data to acquire to the first voltage data.

Furthermore, in the processing of step S15, the control unit 36 may acquire the frequency domain data of the second reflectance and the frequency domain data of the second phase difference acquired in the processing of step S14 as the second offset data and store them in the storage unit 35. In this case, in the processing of step S22, the control unit 36 may acquire the frequency domain data of the second reflectance and the frequency domain data of the second phase difference acquired in the processing of step S21 as the second raw data. In the processing of step 23, the control unit 36 may subtract the inverse Fourier transformed second offset data from the inverse Fourier transformed second raw data to acquire to the second voltage data.

Furthermore, when the voltage amplitude of the pulse signal outputted by the signal generator 31 in the processing of step S10 is constant with respect to frequency, the time domain data of the first reflected wave acquired in the processing of step S12 may be an impulse response to the first incident wave as an impulse signal. In the processing of step S12, the control unit 36 may convert the impulse signal into a step signal by integrating it with respect to time. In this case, the time domain data of the first reflected wave may be a step response to the first incident wave as a step signal. Similarly to the processing of step S12, in the processing of step S18, the control unit 36 may convert the impulse signal into a step signal by integrating it with respect to time.

Furthermore, in the processing in steps S12 and S18, the control unit 36 may, instead of performing the inverse Fourier transform and then integrating the frequency domain data of the first reflectance and the frequency domain data of the first phase difference, perform convolution integration processing in the frequency domain and then perform the inverse Fourier transformation. Such processing enables the control unit 36 to reduce the time required for calculation compared to when the integration processing is performed after performing the inverse Fourier transform.

Furthermore, when the voltage amplitude of the pulse signal outputted by the signal generator 31 in the processing of step S13 is constant with respect to frequency, the time domain data of the second reflected wave acquired in the processing of step S15 may be an impulse response to the second incident wave as an impulse signal. In the processing of step S15, the control unit 36 may convert the impulse signal into a step signal by integrating it with respect to time. In this case, the time domain data of the second reflected wave may be a step response to the second incident wave as a step signal. Similarly to the processing of step S15, in the processing of step S22, the control unit 36 may convert the impulse signal into a step signal by integrating it with respect to time.

Furthermore, in the processing in steps S15 and S22, the control unit 36 may, instead of performing the inverse Fourier transformation and then integrating the frequency domain data of the second reflectance and the frequency domain data of the second phase difference, perform convolution integration processing in the frequency domain and then the inverse Fourier transformation. Such processing enables the control unit 36 to reduce the time required for calculation compared to when the integration processing is performed after performing the inverse Fourier transform.

According to the magnetism detection device 1 of the first embodiment, it is possible to accurately detect the magnetic field strength $H_{EX}$ of the external magnetic field, as described below.

As a comparative example, an example such as is illustrated in FIG. 4 will be given in which the detection device 30 detects the voltage of the reflected wave by inputting the incident wave only from the first end T1 of the transmission line 20 via the connection end C1. In this comparative example, the longer the distance X between the first end T1 and the position P such as are illustrated in FIG. 4 becomes, the longer the propagation distance of the incident wave and the reflected wave propagating on the transmission line 20 becomes, whereby the reflected wave when it reaches the connection end C1 may be attenuated. For example, as shown in FIG. 12, the longer the propagation distance becomes, the smaller the voltage of the reflected wave when it reaches the connection end C1 may be. The propagation distance in FIG. 12 is the distance that the pulse signal as the incident wave and the reflected wave propagates when traveling back and forth between the connection end C1 and the position P. As described above, when the voltage of the reflected wave becomes small, the voltage of the reflected wave is more easily affected by noise. When the voltage of the reflected wave becomes more easily affected by noise, as described above, it may be difficult to accurately detect the magnetic field strength $H_{EX}$ of the external magnetic field.

In contrast to this, in the magnetism detection device 1 according to the first embodiment, the detection device 30 composites the first reflected wave and the second reflected wave. For example, the detection device 30 composites the first voltage data and the second voltage data to acquire composite data. The composite data may, as described below, be less dependent on the propagation distance.

Figure 13:
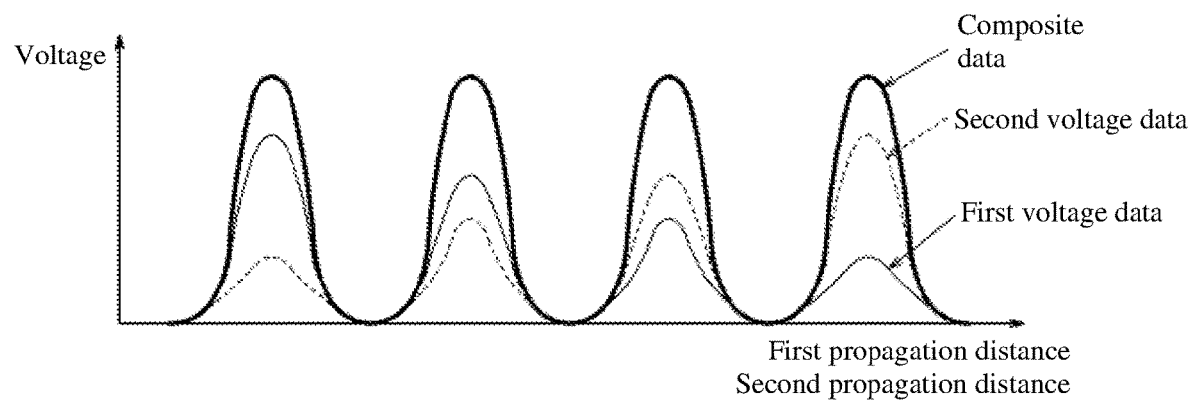
FIG. 13 is a diagram showing composite data according to the first embodiment.

FIG. 13 shows one example of composite data with respect to propagation distance. The first voltage data indicates the voltage of the first reflected wave with respect to a first propagation distance. The first propagation distance is the distance that the pulse signal as the first incident wave and the first reflected wave propagates when traveling back and forth between the connection end C1 and the position P such as are illustrated in FIG. 4. The second voltage data indicates the voltage of the second reflected wave with respect to a second propagation distance. The second propagation distance is the distance that the pulse signal as the second incident wave and the second reflected wave propagates when traveling back and forth between the connection end C2 and the position P such as are illustrated in FIG. 4. The composite data is composited from the first voltage data and the second voltage data.

For example, the longer the distance X between the first end T1 and the position P such as are illustrated in FIG. 4 becomes, the longer the first propagation distance in FIG. 13 may be. That is, the longer the distance X between the first end T1 and the position P becomes, the longer the first propagation distance and the greater the attenuation of the voltage of the first reflected wave may be, as shown in FIG. 13. In contrast to this, the longer the distance X between the first end T1 and the position P becomes, the shorter the second propagation distance in FIG. 13 may be. That is, the longer the distance X between the first end T1 and the position P becomes, the shorter the second propagation distance and smaller the attenuation of the voltage of the second reflected wave may be, as shown in FIG. 13. By compositing such a first reflected wave and second reflected wave, the composite data may be less dependent on the propagation distance. Due to the composite data being less dependent on the propagation distance, the influence of noise when detecting the magnetic field may be reduced.

Therefore, in the present embodiment, due to the detection device 30 compositing the first reflected wave and the second reflected wave, the influence of noise when detecting the magnetic field may be reduced. By configuring as such, the detection device 30 and magnetism detection method according to the present embodiment can accurately detect the magnetic field strength $H_{EX}$ of the external magnetic field.

Furthermore, according to the magnetism detection device 1 of the first embodiment, it is possible to simultaneously detect the strength of the external magnetic field applied to the transmission line 20 and the position of the external magnetic field. By configuring as such, it is possible to detect a non-uniform external magnetic field generated from a detection target in the transmission line 20. Accordingly, the magnetism detection device 1 can detect an external magnetic field generated by a magnetization distribution of the magnetic material to be detected, an external magnetic field generated by a magnetic field distribution due to a defect on a metal surface to be measured, and the like. Furthermore, the magnetism detection device 1 can be applied to various measuring instruments such as a geomagnetism detection device, an eddy current flaw detector, a magnetic microscope, a current sensor, and a magnetoencephalograph.

Moreover, according to the magnetism detection device 1 of the first embodiment, the transmission line set 2 is configured to include one transmission line 20. By configuring the transmission line set 2 to include one transmission line 20, the configuration of the transmission line set 2 may be simplified.

Furthermore, according to the magnetism detection device 1 of the first embodiment, the detection device 30 can acquire the time domain data of the first reflected wave and the time domain data of the second reflected wave as an impulse response or a step response. By configuring as such, the detection device 30 can accurately detect the magnetic field strength.

Second Embodiment

Figure 14:
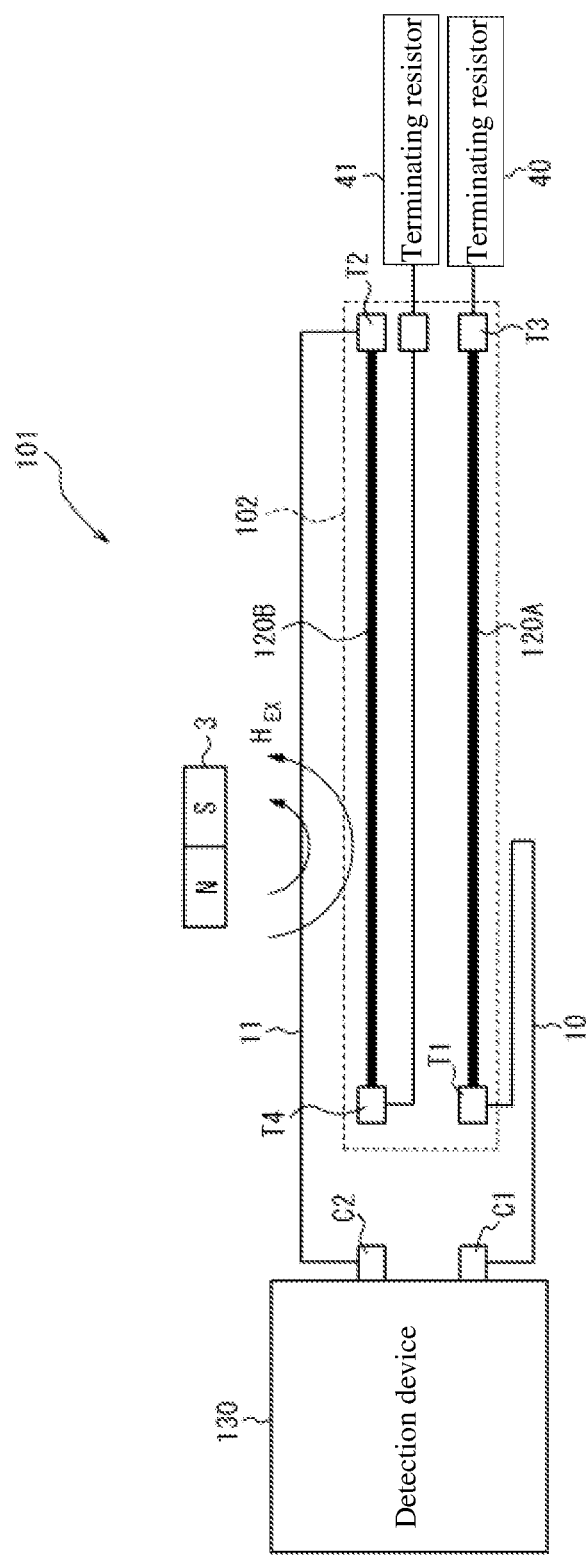
FIG. 14 is a diagram illustrating a schematic configuration of the magnetism detection device according to a second embodiment.

FIG. 14 is a diagram illustrating a schematic configuration of a magnetism detection device 101 according to a second embodiment. The magnetism detection device 101 includes a transmission line set 102 and a detection device 130. The magnetism detection device 101 may further include a first conducting wire 10, a second conducting wire 11, a terminating resistor 40, and a terminating resistor 41.

The transmission line set 102 includes a transmission line (first transmission line) 120A and a transmission line (second transmission line) 120B. The length of the transmission line 120A and the length of the transmission line 120B are the same, a length B. The transmission line 120A and the transmission line 120B may have the same configuration as the transmission line 20 such as is illustrated in FIG. 1 The characteristic impedance of the transmission line 120A and the characteristic impedance of the transmission line 120B may be substantially equal.

The linear transmission line 120A and the linear transmission line 120B are disposed in parallel. The axial direction of the transmission line 120A and the axial direction of the transmission line 120B may be in the same direction. The interval between the transmission line 120A and the transmission line 120B disposed in parallel may be appropriately set in consideration of the magnetic field distribution to be detected, the electrical characteristics of the transmission lines 120A and 120B, and the like.

An end of the transmission line 120A and an end of the transmission line 120B are located at a side of one end of the transmission line set 102. Among the end of the transmission line 120A and the end of the transmission line 120B located at the side of the one end of the transmission line set 102, the first end T1 is located at the end of the transmission line 120A. Among the two ends of the transmission line 120A, a third end T3 is located at the end of the transmission line 120A where the first end T1 is not located.

An end of the transmission line 120A and an end of the transmission line 120B are located at a side of another end of the transmission line set 102. Among the end of the transmission line 120A and the end of the transmission line 120B located at the side of the other end of the transmission line set 102, the second end T2 is located at the end of the transmission line 120B. Among the two ends of the transmission line 120B, a fourth end T4 is located at the end of the transmission line 120B where the second end T2 is not located.

The terminating resistor 40 is connected to the third end T3. The terminating resistor 40 may have a resistance value substantially equal to the characteristic impedance of the transmission line 120A. Due to the terminating resistor 40 being connected to the third end T3, generation of reflected waves may be reduced at the third end T3. The third end T3 may be connected to an attenuator instead of the terminating resistor 40.

The terminating resistor 41 is connected to the fourth end T4. The terminating resistor 41 may have a resistance value substantially equal to the characteristic impedance of the transmission line 120B. Due to the terminating resistor 41 being connected to the fourth end T4, generation of reflected waves may be reduced at the fourth end T4. The fourth end T4 may be connected to an attenuator instead of the terminating resistor 41.

Figure 15:
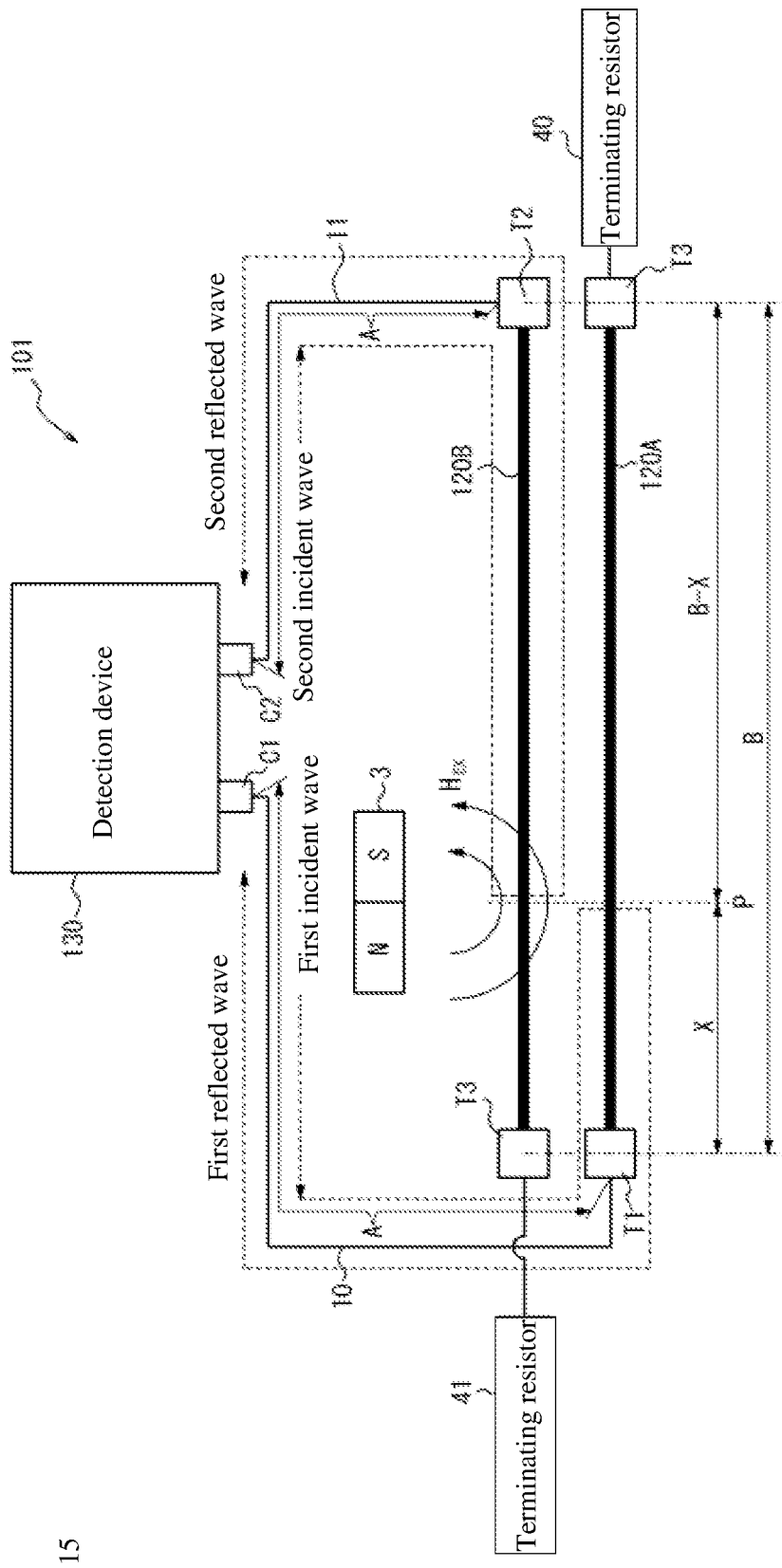
FIG. 15 is a diagram illustrating one example of an incident wave and a reflected wave in the configuration illustrated in FIG. 14.

FIG. 15 illustrates one example of an incident wave and a reflected wave in the configuration illustrated in FIG. 14. A position P is a position where the external magnetic field is applied to the transmission line set 102 by the magnet 3. The distance between the position P and the first end T1 is a distance X.

The detection device 130 may input a pulse signal as the first incident wave to the connection end C1. The first incident wave inputted via the connection end C1 propagates through the first conducting wire 10 and is then inputted to the transmission line 120A via the first end T1. The first incident wave inputted via the first end T1 travels through the transmission line 120A in the direction from the first end T1 to the third end T3. When the first incident wave advances to a position where an impedance mismatch of the transmission line 120A occurs, for example, the position P, the first reflected wave may be generated at the position where the impedance mismatch occurs. The first reflected wave travels through the transmission line 120A in the direction opposite to the direction of travel of the first incident wave, that is, in the direction from the third end T3 to the first end T1. The first reflected wave traveling in the direction opposite to the direction of travel of the first incident wave may reach the connecting end C1 via the first end T1 and the first conducting wire 10.

The detection device 130 may detect the first reflected wave via the connection end C1. Furthermore, the detection device 130 may detect a first time, similarly to the first embodiment.

The detection device 130 may input a pulse signal as the second incident wave to the connection end C2. The second incident wave inputted via the connection end C2 propagates through the second conducting wire 11 and is then inputted to the transmission line 120B via the second end T2. The second incident wave inputted via the second end T2 travels through the transmission line 120B in the direction from the second end T2 to the fourth end T4. When the second incident wave advances to a position where an impedance mismatch of the transmission line 120B occurs, for example, the position P, the second reflected wave may be generated at the position where the impedance mismatch occurs. The second reflected wave travels through the transmission line 120B in the direction opposite to the direction of travel of the second incident wave, that is, in the direction from the fourth end T4 to the second end T2. The second reflected wave traveling in the direction opposite to the direction of travel of the second incident wave may reach the connecting end C2 via the second end T2 and the second conducting wire 11.

The detection device 130 may detect the second reflected wave via the connection end C2. Furthermore, the detection device 130 may detect a second time, similarly to the first embodiment.

The detection device 130 may input the second incident wave to the connection end C2 while inputting the first incident wave to the connection end C1. In this case, detection device 130 may detect the second reflected wave via the connection end C2 while detecting the first reflected wave via the connection end C1.

Due to the detection device 130 detecting the first reflected wave and the second reflected wave, voltage data such as is shown in FIG. 16 can be obtained.

FIG. 16 shows voltage data of a reflected wave with respect to time. In FIG. 16, first voltage data indicating the voltage of the first reflected wave with respect to the first time and second voltage data indicating the voltage of the second reflected wave with respect to the second time are shown together. In FIG. 16, the first time and the second time are shown on the same time axis.

In FIG. 16, it is not limited thereto, but a positive pulse signal is used as the first incident wave such as is illustrated in FIG. 15. Therefore, the first reflected wave is a positive pulse signal. Furthermore, it is not limited thereto, but a negative pulse signal is used as the second incident wave such as is illustrated in FIG. 15. Therefore, the second reflected wave is a negative pulse signal.

The detection device 130 may composite the first reflected wave and the second reflected wave to acquire a composite value, similarly to the first embodiment. The detection device 130 may composite the peak voltage value of the first voltage data and the peak voltage value of the second voltage data to acquire a composite value, similarly to the first embodiment. At such time, in the example shown in FIG. 16, the detection device 130 may subtract the peak voltage value of the second voltage data from the peak voltage value of the first voltage data to acquire a composite value. The detection device 130 may detect the magnetic field strength $H_{EX}$ of the magnetic field applied to the transmission line 20 based on the composite value, similarly to the first embodiment.

The detection device 130 may composite the first voltage data and the second voltage data, similarly to the first embodiment. The detection device 30 may composite the first voltage data and the second voltage data to acquire composite data.

Figure 17:
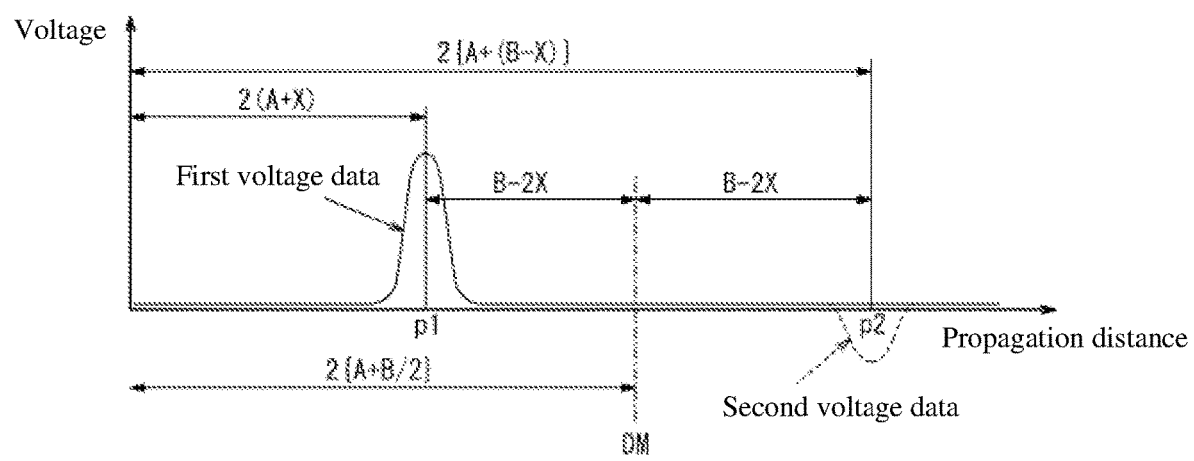
FIG. 17 is a diagram showing voltage data of the reflected wave with respect to propagation distance in the second embodiment.

FIG. 17 shows voltage data indicating a voltage of a reflected wave with respect to propagation distance. In FIG. 17 as well, similarly to FIG. 6, for ease of description, the time shown in FIG. 16 is converted into a propagation distance to which the pulse signal has propagated at that time.

As described in the first embodiment, regardless of the position of the position P, the difference between the reference distance DM and the first distance p1 (B−2X) and the difference between the second distance p2 and the reference distance DM (B−2X) may be equal on the axis of the propagation distance of the voltage data such as is shown in FIG. 17.

The detection device 130 inverts one of the first voltage data and the second voltage data, with the reference distance DM being the axis of symmetry, similarly to the first embodiment. For example, as shown in FIG. 18, the detection device 130 may invert the second voltage data, with the reference distance DM being the axis of symmetry.

When one of the first voltage data and the second voltage data is inverted with the reference distance DM being the axis of symmetry, the detection device 130 composites the first voltage data and the second voltage data to acquire the composite data, similarly to the first embodiment. At such time, in the example shown in FIG. 18, the detection device 130 subtracts the second voltage data from the first voltage data to acquire the composite data. Through such processing, the detection device 130 acquires the composite data such as is shown in FIG. 19

Figure 19:
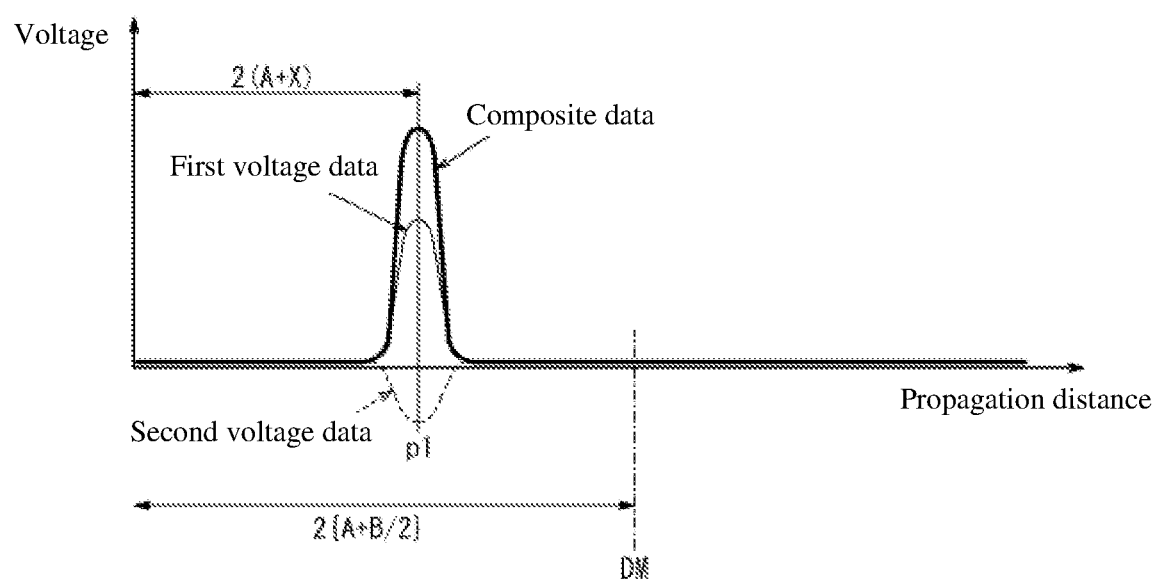
FIG. 19 is a diagram showing composite data of the reflected wave with respect to propagation distance in the second embodiment.

The detection device 130 may acquire the peak value of the voltage of the composite data such as is shown in FIG. 19 as the composite value, similarly to the first embodiment. The detection device 130 detects the magnetic field strength $H_{EX}$ of the magnetic field applied to the transmission line set 102 based on the composite value, similarly to the first embodiment.

Figure 18:
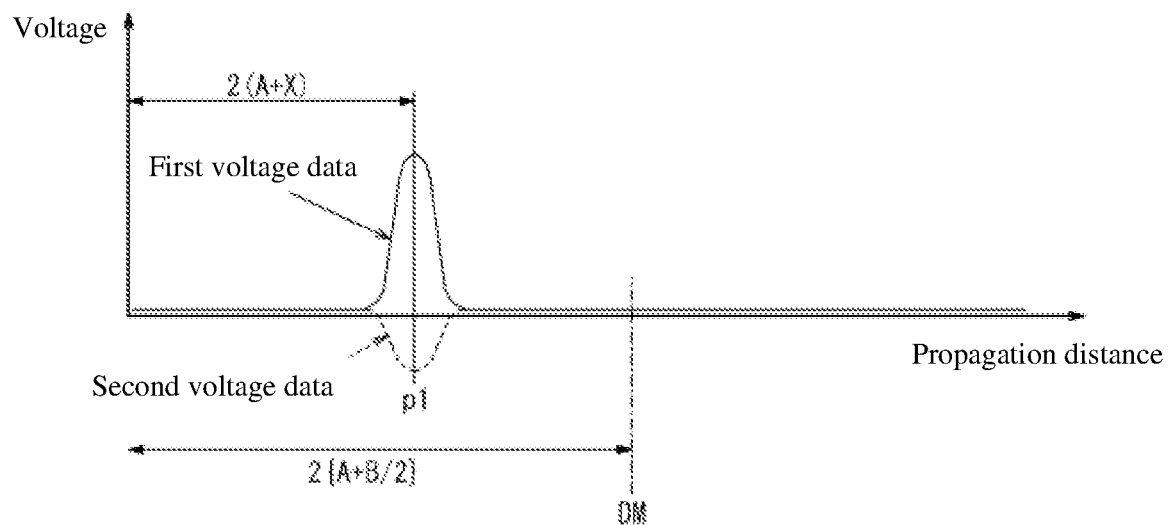
FIG. 18 is a diagram showing voltage data of the reflected wave with respect to propagation distance in the second embodiment.

Here, for ease of description, compositing of the first voltage data indicating the voltage of the first reflected wave with respect to the first time and the second voltage data indicating the voltage of the second reflected wave with respect to the second time is described using FIG. 17 to FIG. 19. Note, similarly to the first embodiment, processing for the first voltage data indicating the voltage of the first reflected wave with respect to the first distance and the second voltage data indicating the voltage of the second reflected wave with respect to the second distance may be rephrased as processing for the first voltage data and the second voltage data such as are shown in FIG. 16. For example, processing for inverting one of the first voltage distribution and the second voltage distribution such as are shown in FIG. 17 with the reference distance DM being the axis of symmetry may be rephrased as processing for inverting one of the first voltage distribution and the second voltage distribution such as are shown in FIG. 16 with the reference time tM being the axis of symmetry. Furthermore, processing for compositing the first voltage data and the second voltage data on the axis of the propagation distance such as is shown in FIG. 19 may be rephrased as processing for compositing the first voltage data and the second voltage data on the time axis of the first time and the second time.

The detection device 130 may use at least one of the first time and the second time to detect the position P at which the external magnetic field of the magnetic field strength $H_{EX}$ is applied, similarly to the first embodiment.

(Configuration Example of Detection Device)

One example of a configuration of the detection device 130 will be described with reference to FIG. 20. However, the configuration of the detection device 130 is not limited to a configuration such as is illustrated in FIG. 20. For example, the detection device 130 may be configured as a vector network analyzer such as is illustrated in FIG. 9.

As illustrated in FIG. 20, the detection device 130 has a signal generator 131, connectors 132 and 133, input circuits 134 and 135, ADCs (analog-to-digital converter) 136 and 137, a storage unit 138, and a control unit 139.

The signal generator 131 generates a voltage pulse signal. The signal generator 131 is connected to the connector 132. The pulse signal generated by the signal generator 131 is inputted to the connector 132 as the first incident wave. Furthermore, the signal generator 131 is connected to the connector 133. The pulse signal generated by the signal generator 131 is inputted to the connector 133 as the second incident wave.

The signal generator 131 may generate a short pulse signal or a pulse signal having a fast rise time as the pulse signal. By generating such a pulse signal, when the detection device 130 detects a plurality of reflected waves, it may become easier to separate the plurality of reflected waves. Furthermore, by generating such a pulse signal, the power consumption of the signal generator 131 may be reduced.

The pulse signal generated by the signal generator 131 is not particularly limited but may be, for example, a rise time of 200 [ps], a pulse width of 500 [ps], a pulse height of 1 [V], and the like.

The pulse signal generated by the signal generator 131 may be any shape. The pulse signal generated by the signal generator 131 may be, for example, a rectangular wave shape, a sinusoidal shape, a triangular wave shape, a saw wave shape, or the like.

The signal generator 131 may simultaneously generate a pulse signal as the first incident wave and a pulse signal as the second incident wave. For example, when simultaneously generating the first incident wave and the second incident wave, the signal generator 131 may generate a first incident wave and a second incident wave having a same positive or negative voltage polarity. As another example, when simultaneously generating the first incident wave and the second incident wave, the signal generator 131 may generate a first incident wave and a second incident wave having different positive or negative voltage polarities. When generating a first incident wave and a second incident wave having different positive or negative voltage polarities, the signal generator 131 may use differential output to generate a pulse signal as the first incident wave and a pulse signal as the second incident wave.

The connector 132 connects the signal generator 131, the input circuit 134, and the connection end C1 to each other. The connector 132 may be, for example, a T connector. The first incident wave from the signal generator 131 is inputted to the first end T1 of the transmission line 120A via the connector 132, the connection end C1, and the first conducting wire 10. Furthermore, the first incident wave from the signal generator 131 is inputted to the input circuit 134 via the connector 132. The first reflected wave from the first end T1 of the transmission line 120A is inputted to the input circuit 134 via the first conducting wire 10, the connection end C1, and the connector 132.

The connector 133 connects the signal generator 131, the input circuit 135, and the connection end C2 to each other. The connector 133 may be, for example, a T connector. The second incident wave from the signal generator 131 is inputted to the second end T2 of the transmission line 120B via the connector 133, the connection end C2, and the second conducting wire 11. Furthermore, the second incident wave from the signal generator 131 is inputted to the input circuit 135 via the connector 133. The second reflected wave from the second end T2 of the transmission line 120B is inputted to the input circuit 135 via the second conducting wire 11, the connection end C2, and the connector 133.

The input circuit 134 detects the first incident wave inputted by the signal generator 131 via the connector 132. The input circuit 134 detects the first reflected wave inputted by the first end T1 of the transmission line 120A via the first conducting wire 10, the connection end C1, and the connector 132. The input circuit 134 may be configured to include an attenuation circuit, a preamplifier, and the like. The input circuit 134 adjusts the voltage amplitudes of the first incident wave and the first reflected wave such that the voltage amplitudes of the first incident wave and the first reflected wave input as analog signals are in an appropriate range for the input specifications of the ADC 136. The input circuit 134 outputs the adjusted analog signal to the ADC 136.

The input circuit 135 detects the second incident wave inputted by the signal generator 131 via the connector 133. The input circuit 135 detects the second reflected wave inputted by the second end T2 of the transmission line 120B via the second conducting wire 11, the connection end C2, and the connector 133. The input circuit 135 may be configured to include an attenuation circuit, a preamplifier, and the like. The input circuit 135 adjusts the voltage amplitudes of the second incident wave and the second reflected wave such that the voltage amplitudes of the second incident wave and the second reflected wave input as analog signals are in an appropriate range for the input specifications of the ADC 137. The input circuit 135 outputs the adjusted analog signal to the ADC 137.

An analog signal is inputted to the ADC 136 by the input circuit 134. The ADC 136 converts the inputted analog signal into digital data. The ADC 136 outputs the converted digital data to the control unit 139.

An analog signal is inputted to the ADC 137 by the input circuit 135. The ADC 137 converts the inputted analog signal into digital data. The ADC 137 outputs the converted digital data to the control unit 139.

The storage unit 138 is, for example, a semiconductor memory, a magnetic memory, an optical memory, or the like, but is not limited thereto. The storage unit 138 may function as, for example, a main storage device, an auxiliary storage device, or a cache memory. The storage unit 138 stores data used for operation of the detection device 130 and data obtained by the operation of the detection device 130.

The control unit 139 includes at least one processor, at least one dedicated circuit, or a combination thereof, similarly to the control unit 36 such as is illustrated in FIG. 9. The control unit 139 executes processing related to the operation of the detection device 130 while controlling each unit of the detection device 130.

The control unit 139 controls the signal generator 131 to cause the signal generator 131 to output the first incident wave. Due to the signal generator 131 outputting the first incident wave, the control unit 139 acquires digital data of the first incident wave and the first reflected wave from the ADC 136. The control unit 139 detects the first time and the voltage of the first reflected wave based on the acquired digital data. The control unit 139 detects the first time and the voltage of the first reflected wave to acquire the first voltage data such as is illustrated in FIG. 16.

The control unit 139 controls the signal generator 131 to cause the signal generator 131 to output the second incident wave. Due to the signal generator 131 outputting the second incident wave, the control unit 139 acquires digital data of the second incident wave and the second reflected wave from the ADC 137. The control unit 139 detects the second time and the voltage of the second reflected wave based on the acquired digital data. The control unit 139 detects the second time and the voltage of the second reflected wave to acquire the second voltage data such as is illustrated in FIG. 16.

The control unit 139 uses the first voltage data and the second voltage data to detect the strength of the magnetic field applied to the transmission line set 102, as described above. Furthermore, the control unit 139 uses at least one of the first time and the second time to detect the position of the magnetic field applied to the transmission line set 102.

The control unit 139 may use first offset data and second offset data when detecting the strength and position of the magnetic field applied to the transmission line set 102, similarly to the first embodiment.

The control unit 139 may subtract the first offset data from first raw data to acquire the first voltage data for detecting the strength and position of the magnetic field to be detected. The first raw data is the first voltage data detected when the magnetic field to be detected is applied to the transmission line set 102.

The control unit 139 may subtract the second offset data from second raw data to acquire the second voltage data for detecting the strength and position of the magnetic field to be detected. The second raw data is the second voltage data detected when the magnetic field to be detected is applied to the transmission line set 102.

The control unit 139 may store the first voltage data detected when the magnetic field to be detected is not applied to the transmission line set 102 to the storage unit 138 as the first offset data. The control unit 139 may store the second voltage data detected when the magnetic field to be detected is not applied to the transmission line set 102 to the storage unit 138 as the second offset data.

By using such first offset data and second offset data, the influence of reflected waves generated by factors other than the magnetic field to be detected being applied to the transmission line set 102 may be reduced, as described above in the first embodiment.

(Operation Example of Magnetism Detection Device)

Figure 21:
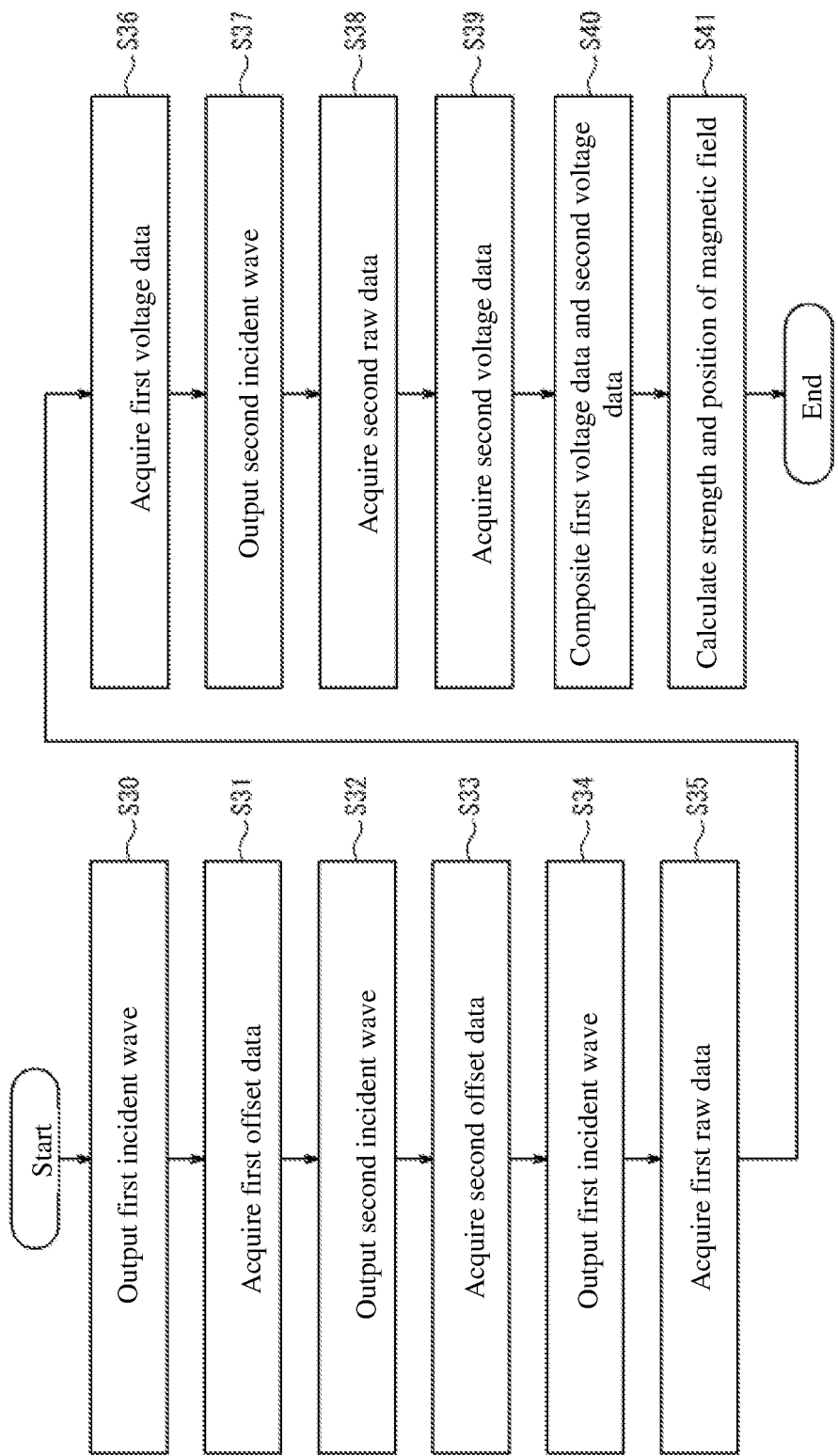
FIG. 21 is a flowchart showing one example of operation of the magnetism detection device according to the second embodiment.

One example of operation of the magnetism detection device 101 will be described with reference to FIG. 21. Hereinafter, the magnetic field to be detected is the external magnetic field applied to the transmission line set 102. No external magnetic field is applied to the transmission line set 102 when the control unit 139 executes processing of a step S30.

The control unit 139 controls the signal generator 131 to cause the signal generator 131 to output the first incident wave when the external magnetic field is not applied to the transmission line set 102 (step S30).

The control unit 139 acquires digital data of the first incident wave and the first reflected wave from the ADC 136 and acquires the first voltage data (step S31). In the processing of step S31, the control unit 139 acquires this first voltage data as the first offset data and stores it in the storage unit 138.

The control unit 139 controls the signal generator 131 to cause the signal generator 131 to output the second incident wave when the external magnetic field is not applied to the transmission line set 102 (step S32).

The control unit 139 acquires digital data of the second incident wave and the second reflected wave from the ADC 137 and acquires the second voltage data (step S33). In the processing of step S33, the control unit 139 acquires this second voltage data as the second offset data and stores it in the storage unit 138.

After the processing of step S33 is executed, the external magnetic field is applied to the transmission line set 102.

The control unit 139 controls the signal generator 131 to cause the signal generator 131 to output the first incident wave when the external magnetic field is applied to the transmission line set 102 (step S34).

The control unit 139 acquires the digital data of the first incident wave and the first reflected wave from the ADC 136 and acquires the first voltage data (step S35). In the processing of step S35, the control unit 139 acquires this first voltage data as the first raw data.

The control unit 139 acquires the first voltage data by subtracting the first offset data acquired in the processing of step S31 from the first raw data acquired in the processing of step S35 (step S36).

The control unit 139 controls the signal generator 131 to cause the signal generator 131 to output the second incident wave when the external magnetic field is applied to the transmission line set 102 (step S37).

The control unit 139 acquires the digital data of the second incident wave and the second reflected wave from the ADC 137 and acquires the second voltage data (step S38). In the processing of step S38, the control unit 139 acquires this second voltage data as the second raw data.

The control unit 139 acquires the second voltage data by subtracting the second offset data acquired in the processing of step S33 from the second raw data acquired in the processing of step S38 (step S39).

The control unit 139 composites the first voltage data acquired in the processing of step S36 and the second voltage data acquired in the processing of step S39 to generate composite data (step S40).

The control unit 139 detects the strength of the magnetic field applied to the transmission line set 102 based on the composite data generated in the processing of step S40 (step S41). In the processing of step S41, the control unit 139 detects the position of the magnetic field applied to the transmission line 20 based on either the first time or the second time.

Note, the control unit 139 may execute the processing of step S30 and the processing of step S32 simultaneously. Furthermore, the control unit 139 may execute the processing of step S34 and the processing of step S37 simultaneously.

Thus, in the second embodiment, the transmission line set 102 includes the transmission line 120A and the transmission line 120B. Due to the transmission line set 102 including the transmission line 120A and the transmission line 120B, the detection device 130 can input the second incident wave to the second end T2 of the transmission line 120B while inputting the first incident wave to the first end T1 of the transmission line 120A. By configuring as such, in the second embodiment, the time required for the detection device 130 to detect the strength and position of the magnetic field may be shortened.

Furthermore, in the second embodiment, the detection device 130 can acquire the first voltage data and the second voltage data without executing arithmetic processing such as inverse Fourier transformation. Due to such a configuration, the arithmetic processing of the detection device 130 may be simplified.

Other configurations and effects of the detection device 130 according to the second embodiment are the same as those of the detection device 30 according to the first embodiment.

(Another Example of Coaxial Cable)

Figure 22:
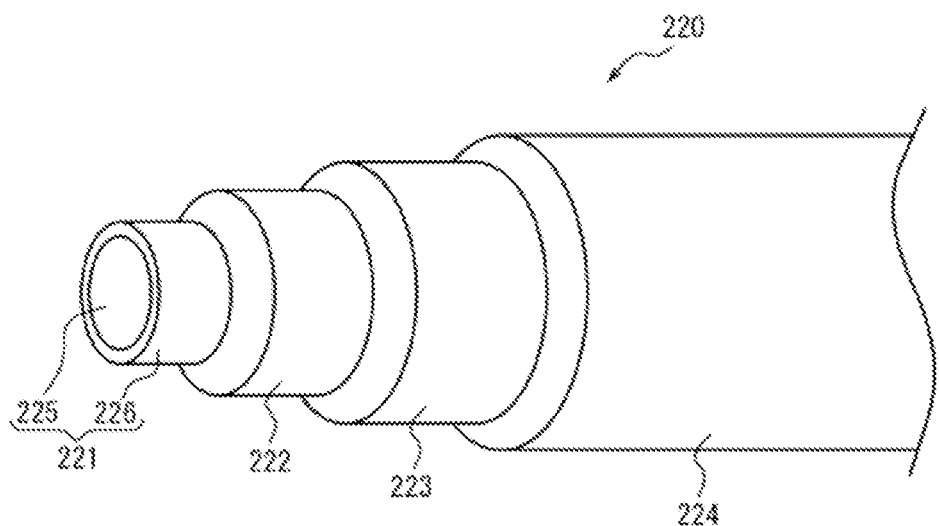
FIG. 22 is a diagram illustrating another example of the transmission line configured as a coaxial cable.

FIG. 22 illustrates another example of a coaxial cable. The coaxial cable such as is illustrated in FIG. 22 may be adopted as the transmission line 20 such as is illustrated in FIG. 1 and may be adopted as the transmission lines 120A and 120B such as are illustrated in FIG. 14.

A transmission line 220 includes a first conductor (signal wire) 221, a dielectric 222, a second conductor (shield wire) 223, and a covering 224. The dielectric 222, the second conductor 223, and the covering 224 each have the same configuration as the dielectric 22, the second conductor 23, and the covering 24 such as are illustrated in FIG. 3, respectively.

The first conductor 221 includes a conductor 225 and a magnetic film 226. The conductor 225 is a non-magnetic conductor. The magnetic film 226 is a film containing a magnetic material. The magnetic film 226 is formed on the surface of the conductor 225 (conductor surface). The magnetic material contained by the magnetic film 226 may be the same magnetic material as the magnetic material contained in the first conductor 21 such as is illustrated in FIG. 3.

The magnetic film 226 may be formed on the surface of the conductor 225 by, for example, plating, vapor deposition, sputtering, CVD (chemical vapor deposition), or the like.

Within the first conductor 221, due to the conductor 225 being a non-magnetic conductor, impedance change due to magnetization (domain wall movement) may less readily occur. Therefore, hysteresis may less readily occur in the first conductor 221. By configuring as such, the magnetic field may be detected by the transmission line 220 at high sensitivity.

(Yet Another Example of Coaxial Cable)

Figure 23:
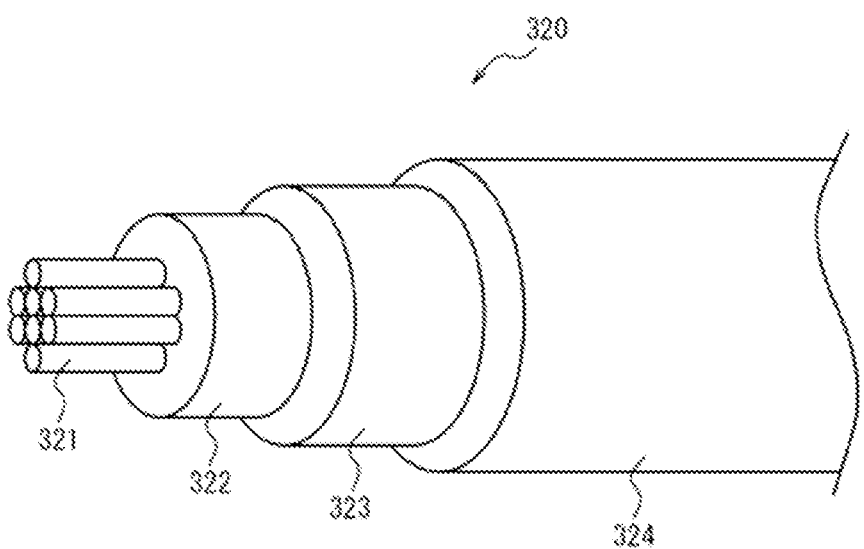
FIG. 23 is a diagram illustrating yet another example of the transmission line configured as a coaxial cable.

FIG. 23 illustrates yet another example of a coaxial cable. The coaxial cable such as is illustrated in FIG. 23 may be adopted as the transmission line 20 such as is illustrated in FIG. 1 and may be adopted as the transmission lines 120A and 120B such as are illustrated in FIG. 14.

A transmission line 320 includes a plurality of a first conductor (signal wire) 321, a dielectric 322, a second conductor (shield wire) 323, and a covering 324. The dielectric 322, the second conductor 323, and the covering 324 each have the same configuration as the dielectric 22, the second conductor 23, and the covering 24 such as are illustrated in FIG. 3, respectively.

Each configuration of the plurality of the first conductor 321 may be a similar configuration to the first conductor 21 such as is illustrated in FIG. 3. The plurality of the first conductor 321 is bundled within the dielectric 322.

By thus configuring the plurality of the first conductor 321 in a bundle, overall resistance loss of the plurality of the first conductor 321 may be reduced. Therefore, even when the length of the transmission line 320 is long, the attenuation of the incident wave and the reflected wave may be small. Accordingly, it is possible to use the long transmission line 320 to detect the position and strength of the magnetic field applied to the transmission line 320.

(Another Example of Transmission Line)

The transmission lines 20, 120A, and 120B need not be configured as a coaxial cable, insofar as it is a structure having characteristic impedance. For example, the transmission lines 20, 120A, and 120B may be configured as a parallel double line, a strip line, a microstrip line, a coplanar line or a waveguide. FIGS. 24 to 27 illustrate configuration examples other than coaxial cables applicable to the transmission lines 20, 120A, and 120B.

Figure 24:
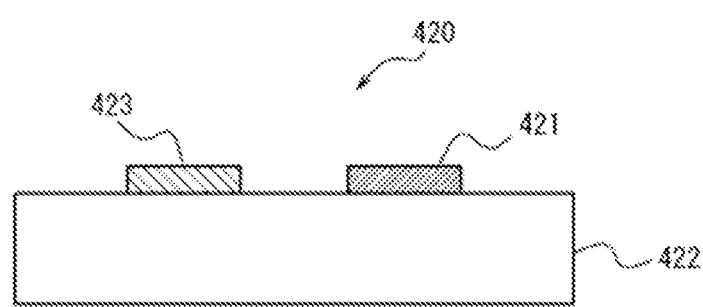
FIG. 24 is a diagram illustrating a schematic configuration of the transmission line configured as a parallel double line.

FIG. 24 is a diagram illustrating a schematic configuration of a transmission line 420 configured as a parallel double line. FIG. 24 corresponds to a cross-section of the transmission line. The transmission line 420 includes a first conductor (signal wire) 421, a dielectric 422, and a second conductor (shield wire) 423. The first conductor 421 contains a magnetic material, similarly to the first conductor 21 such as is illustrated in FIG. 3. The first conductor 421 is formed as a thin film on the dielectric 422.

Figure 25:
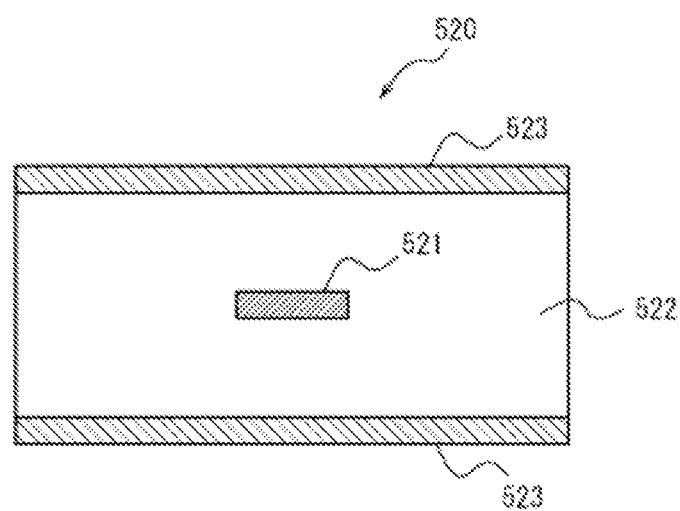
FIG. 25 is a diagram illustrating a schematic configuration of the transmission line configured as a strip line.

FIG. 25 is a diagram illustrating a schematic configuration of a transmission line 520 configured as a strip line. FIG. 25 corresponds to a cross-section of the transmission line 520. The transmission line 520 includes a first conductor (signal wire) 521, a dielectric 522, and a second conductor (shield wire) 523. The first conductor 521 contains a magnetic material, similarly to the first conductor 21 such as is illustrated in FIG. 3. The first conductor 521 is formed as a thin film within the dielectric 522.

Figure 26:
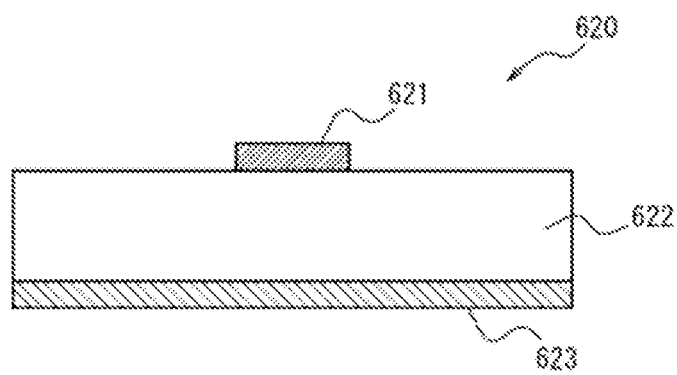
FIG. 26 is a diagram illustrating a schematic configuration of the transmission line configured as a microstrip line.

FIG. 26 is a diagram illustrating a schematic configuration of a transmission line 620 configured as a microstrip line.

FIG. 26 corresponds to a cross-section of the transmission line 620. The transmission line 620 includes a first conductor (signal wire) 621, a dielectric 622, and a second conductor (shield wire) 623. The first conductor 621 contains a magnetic material, similarly to the first conductor 21 such as is illustrated in FIG. 3. The first conductor 621 is formed as a thin film on the dielectric 622.

Figure 27:
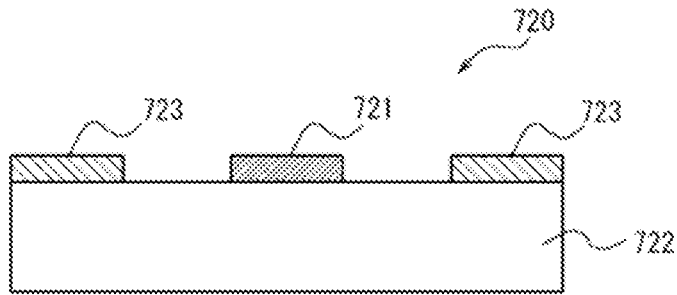
FIG. 27 is a diagram illustrating a schematic configuration of the transmission line configured as a coplanar line.

FIG. 27 is a diagram illustrating a schematic configuration of a transmission line 720 configured as a coplanar line. FIG. 27 corresponds to a cross-section of the transmission line 720. The transmission line 720 includes a first conductor (signal wire) 721, a dielectric 722, and a second conductor (shield wire) 723. The first conductor 721 contains a magnetic material, similarly to the first conductor 21 such as is illustrated in FIG. 3. The first conductor 721 is formed as a thin film on the dielectric 722.

The dielectrics 422, 522, 622, and 722 such as are illustrated in FIG. 24 to FIG. 27, respectively, may each be, for example, an insulator such as PTFE (polytetrafluoroethylene) or polyethylene, similarly to the dielectric 22 such as is illustrated in FIG. 3.

The second conductors 423, 523, 623, and 723 such as are illustrated in FIG. 24 to FIG. 27, respectively, may each be configured of, for example, a copper material, similarly to the second conductor 23 such as is illustrated in FIG. 3.

The magnetic impedance effect in the transmission lines 420, 520, 620, and 720 such as are illustrated in FIG. 24 to FIG. 27 will be described below. The transmission lines 420, 520, 620, and 720 respectively include a thin film-shaped first conductor 421, 521, 621, and 721. Assuming that a thickness of each of the first conductors 421, 521, 621 and 721 is d, when the skin effect is remarkable (skin depth δ<<d/2), the impedance Z of the transmission line, which changes according to the magnetic impedance effect, is represented by the following formula (7) and formula (8).

[Equation 7]

$$Z = R + j\omega L \cong \frac{\omega\mu\delta l}{4w}(1-j) = \frac{l}{4w}(1-j)\sqrt{2\rho\omega\mu(H_{EX})} \quad (7)$$

[Equation 8]

$$\delta = \int \frac{2\rho}{\omega\mu} \quad (8)$$

In formula (7), the width w is a width of the first conductors 421, 521, 621, and 721. The length l is a length of the first conductors 421, 521, 621, and 721.

Similarly to the transmission line 20 configured as a coaxial cable such as is illustrated in FIG. 3, the magnetic permeability of the first conductors 421, 521, 621 and 721 in the circumferential direction changes due to rotation of the magnetic moment, even in the transmission lines 420, 520, 620, and 720 such as are illustrated in FIG. 24 to FIG. 27. The impedance of the transmission lines 420, 520, 620, and 720 depends on the magnetic permeability of the first conductors 421, 521, 621, and 721 in the circumferential direction. Therefore, when the magnetic permeability in the circumferential direction of the first conductors 421, 521, 621, and 721 at the position where the external magnetic field is applied changes, the impedance of the transmission lines 420, 520, 620, and 720 at the position where the external magnetic field is applied changes.

When the detection device 30 such as is illustrated in FIG. 1 uses the transmission line 420, 520, 620, or 720 such as is illustrated in FIG. 24 to FIG. 27 instead of the transmission line 20, formula (7) may be used instead of formula (3) when detecting the magnetic field strength $H_{EX}$. When the detection device 130 such as is illustrated in FIG. 14 uses the transmission line 420, 520, 620, or 720 such as is illustrated in FIG. 24 to FIG. 27 instead of the transmission lines 120A and 120B, formula (7) may be used instead of formula (3) when detecting the magnetic field strength $H_{EX}$. Furthermore, when detecting the magnetic field strength $H_{EX}$, the detection device 30 or 130 may calculate (detect) the magnetic field strength $H_{EX}$ by using, instead of formula (7), an equation (for example, a linear approximation equation) approximating formula (7). Moreover, when detecting the magnetic field strength $H_{EX}$, the detection device 30 or 130 may calculate (detect) the magnetic field strength $H_{EX}$ by using, instead of formula (7), a previously acquired impedance $Z_M$ directly associated with the magnetic field strength $H_{EX}$.

The transmission lines 420, 520, 620, and 720 such as are illustrated in FIG. 24 to FIG. 27 may be configured from, for example, a flexible substrate. Configuring the transmission lines 420, 520, 620, and 720 as a flexible substrate enables them to be flexible. Due to the transmission lines 420, 520, 620, and 720 being flexible, the degree of freedom of arrangement of the transmission lines 420, 520, 620, and 720 may increase, similarly to when configuring using a coaxial cable.

The transmission lines 420, 520, 620, and 720 such as are illustrated in FIG. 24 to FIG. 27 may be configured to have a magnetic film formed on a surface of a non-magnetic conductor, similarly to the first conductor 221 such as is illustrated in FIG. 22.

The transmission lines 420, 520, 620, and 720 such as are illustrated in FIG. 24 to FIG. 27 may be configured to respectively include a plurality of the first conductors 421, 521, 621, and 721, similarly to the transmission line 320 such as is illustrated in FIG. 23.

(Application of Bias Magnetic Field)

Figure 28:
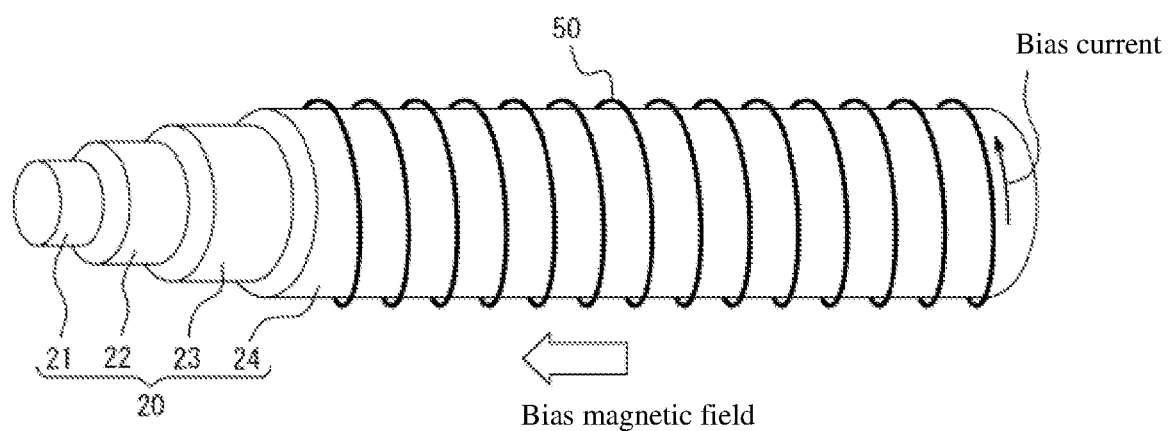
FIG. 28 is a diagram illustrating one example of a transmission line on which a coil is disposed.

As illustrated in FIG. 28, the magnetism detection device 1 such as is illustrated in FIG. 1 may include a coil 50 around the transmission line 20. The coil 50 can apply a bias magnetic field. For example, as illustrated in FIG. 28, a bias current can be applied to the coil 50. By applying the bias current to the coil 50, a bias magnetic field may be applied in the axial direction (longitudinal direction) of the transmission line 20.

Figure 29:
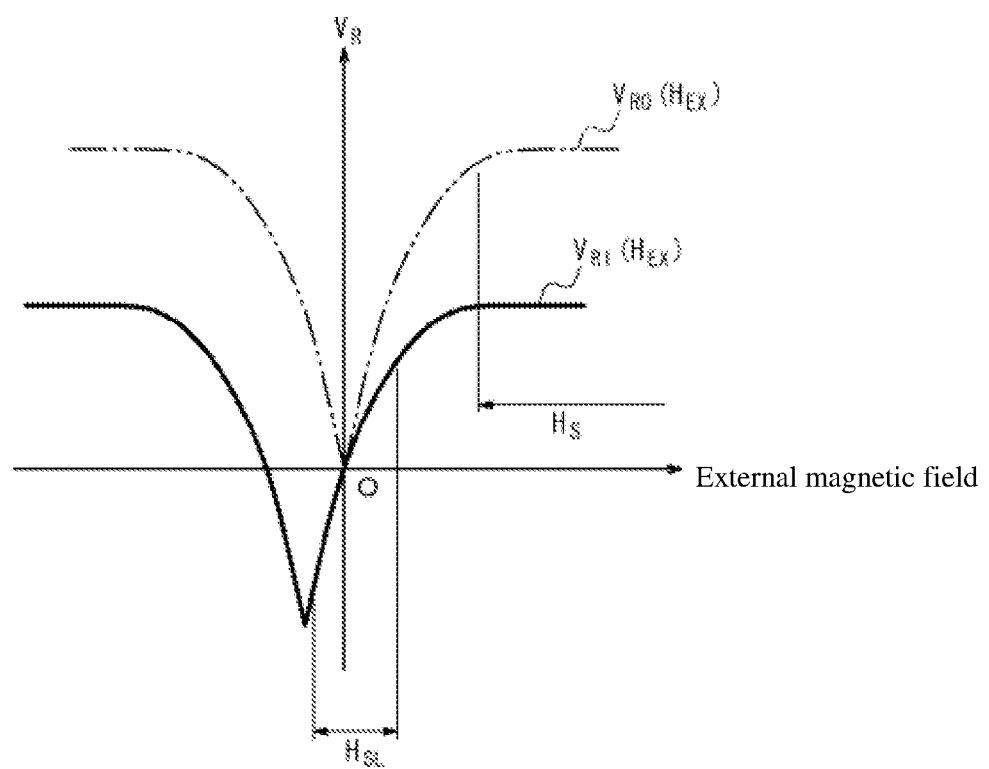
FIG. 29 is a diagram showing the relationship between the magnetic field and the amplitude of the reflected wave in a state wherein a bias magnetic field is applied.

When the bias magnetic field is uniformly applied to the transmission line 20 in the positive direction by the coil 50, the characteristic impedance of the transmission line 20 changes from the impedance $Z_0$ to an impedance $Z_1$ ($Z_0 < Z_1$). As illustrated in FIG. 29, by changing the characteristic impedance of the transmission line 20, the relationship between the magnetic field applied to the transmission line 20 and the voltage $V_R$ of the reflected wave may be offset from the graph $V_{R0}$ ($H_{EX}$) to the graph $V_{R1}$ ($H_{EX}$). When an external magnetic field is not applied to the transmission line 20, the characteristic impedance becomes uniform at $Z_1$, and thus no reflected wave is generated.

When the external magnetic field is a positive magnetic field, the external magnetic field is applied to the transmission line 20 in addition to the bias magnetic field. Therefore, the characteristic impedance at the position where the magnetic field is applied on the transmission line 20 is the impedance ($Z_1+\Delta Z$). At the position where the impedance is ($Z_1+\Delta Z$) in the transmission line 20, a reflected wave having the same phase as the incident wave may be generated. For example, when the incident wave is a positive pulse signal, a positive pulse signal reflected wave may be generated.

When the external magnetic field is a negative magnetic field, the external magnetic field is applied to the transmission line 20 in the direction opposite to the bias magnetic field. Therefore, the characteristic impedance at the position where the magnetic field is applied on the transmission line 20 is the impedance ($Z_1-\Delta Z$). At the position where the impedance is ($Z_1-\Delta Z$) in the transmission line 20, a reflected wave having the opposite phase as the incident wave is generated. For example, when the incident wave is a positive pulse signal, a negative pulse signal reflected wave may be generated.

By configuring as such, the magnetism detection device 1 can determine not only the strength of the magnetic field applied to the transmission line 20, but also whether a positive magnetic field is applied or a negative magnetic field is applied. The strength of the bias magnetic field may be smaller than a saturated magnetic field (magnetic field in the range indicated by $H_s$ in FIG. 12). Furthermore, the strength of the bias magnetic field may be such that linearity of a sensor is improved (so that the range indicated by $H_{sL}$ in FIG. 12 is substantially linear). Here, the strength of the bias magnetic field is arbitrary.

Similarly to the magnetism detection device 1 such as is illustrated in FIG. 1, the magnetism detection device 101 such as is illustrated in FIG. 14 may include a coil 50 around each of the transmission line 120A and the transmission line 120B.

It is obvious to a person having ordinary skill in the art that the present disclosure can be realized in prescribed embodiments other than the embodiment described above without departing from the spirit or essential characteristics of the present disclosure. Accordingly, the descriptions above are exemplary, and the present disclosure is not limited thereto. The scope of the disclosure is defined by the attached claims, not by the descriptions above. Among all conceivable changes, a number of changes within an equal scope are contained in such scope of the disclosure.

For example, the arrangement, number, and the like of each component described above are not limited to the foregoing description and the contents illustrated in the drawings. The arrangement, number, and the like of each component described above may be of any configuration insofar as the function thereof can be realized.

For example, the processing for the detection device 30 and the detection device 130 to composite the first reflected wave and the second reflected wave is not limited to the processing described above. The mode of attenuation of the incident wave and the reflected wave may differ according to the configuration of the transmission line. For example, the degree of attenuation of the reflected wave may be proportional to the propagation distance or may increase as the propagation distance increases. The detection device 30 and the detection device 130 may execute correction according to the mode of attenuation in the processing for compositing the first reflected wave and the second reflected wave.

For example, the detection device 30 such as is illustrated in FIG. 1 may use formula (2) instead of formula (3) according to the configuration of the transmission line set 2 when detecting the magnetic field strength $H_{EX}$. Furthermore, the detection device 130 such as is illustrated in FIG. 14 may use formula (2) instead of formula (3) according to the configuration of the transmission line set 102 when detecting the magnetic field strength $H_{EX}$. Here, when detecting the magnetic field strength $H_{EX}$, the detection device 30 and the detection device 130 may calculate (detect) the magnetic field strength $H_{EX}$ by using, instead of formula (2), an equation (for example, a linear approximation equation) approximating formula (2). Moreover, when detecting the magnetic field strength $H_{EX}$, the detection device 30 and the detection device 130 may calculate (detect) the magnetic field strength $H_{EX}$ by using, instead of formula (2), a previously acquired impedance $Z_M$ directly associated with the magnetic field strength $H_{EX}$.

For example, the detection device 30 may convert the first voltage data and the second voltage data such as are shown in FIG. 5 into the first voltage data and the second voltage data such as are shown in FIG. 6 by using formula (6) to convert the first time and the second time into the first distance and the second distance, respectively. In which case, the detection device 30 may execute the compositing processing described above for the first voltage data indicating the voltage of the first reflected wave with respect to the first distance and the second voltage data indicating the voltage of the second reflected wave with respect to the second distance such as are shown in FIG. 6.

For example, the detection device 130 may convert the first voltage data and the second voltage data such as are shown in FIG. 16 into the first voltage data and the second voltage data such as are shown in FIG. 17 by using formula (6) to convert the first time and the second time into the first distance and the second distance, respectively. In which case, the detection device 130 may execute the compositing processing described above for the first voltage data indicating the voltage of the first reflected wave with respect to the first distance and the second voltage data indicating the voltage of the second reflected wave with respect to the second distance such as are shown in FIG. 17.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

1, 101 Magnetism detection device
2, 102 Transmission line set
3 Magnet
10 First conducting wire
11 Second conducting wire
20, 220, 320, 420, 520, 620, 720 Transmission line
21, 221, 321, 421, 521, 621, 721 First conductor
22, 222, 322, 422, 522, 622, 722 Dielectric
23, 223, 323, 423, 523, 623, 723 Second conductor
24, 224, 324 Covering
30, 130 Detection device (Detector)
31, 131 Signal generator
32 Directional coupler
33 Directional coupler
34 Signal wave detector
35, 138 Storage unit
36, 139 Control unit
40, 41 Terminating resistor
50 Coil
120A Transmission line (first transmission line)
120B Transmission line (second transmission line)
132, 133 Connector
134, 135 Input circuit
136, 137 ADC
225 Conductor
226 Magnetic film

What is claimed is:

1. A magnetism detection device, comprising:
a transmission line set includes a transmission line comprising a linear first conductor comprising a magnetic material; and
a detector that:
inputs, from a first end of the transmission line set, a pulse signal as a first incident wave;
detects, at the first end, a first reflected wave of the first incident wave;
inputs, from a second end opposite to the first end, a pulse signal as a second incident wave; and
detects, at the second end, a second reflected wave of the second incident wave; and
detects a strength of a magnetic field applied to the transmission line set based on compositing of the first reflected wave and the second reflected wave.

2. The magnetism detection device according to claim 1, wherein the detector detects a position of the magnetic field applied to the transmission line set based on a time period from a timepoint when the first incident wave is inputted to a timepoint when the first reflected wave is detected.

3. The magnetism detection device according to claim 1, wherein
the transmission line further comprises a dielectric and a second conductor, and
the transmission line is any of a coaxial cable, a parallel double line, a strip line, a microstrip line, a coplanar line, and a waveguide.

4. The magnetism detection device according to claim 1, wherein the magnetic material is distributed substantially uniformly in the linear first conductor, or a magnetic film comprising the magnetic material is formed on a conductor surface of the linear first conductor.

5. The magnetism detection device according to claim 1, wherein the transmission line further comprises one or more additional first conductors.

6. The magnetism detection device according to claim 1, further comprising:
a coil on the transmission line, wherein
the coil is capable of applying a bias magnetic field.

7. The magnetism detection device according to claim 1, wherein the detector: acquires first voltage data indicating a voltage of the first reflected wave after a first time period, wherein the first time period is from a timepoint when the first incident wave is inputted to a timepoint when the first reflected wave is detected; acquires second voltage data indicating a voltage of the second reflected wave after a second time period, wherein the second time period is from a timepoint when the second incident wave is inputted to a timepoint when the second reflected wave is detected; inverts, in a graph with voltage on a vertical axis and time on a horizontal axis, one of the first voltage data and the second voltage data line-symmetrically with a reference time that is an axis of symmetry perpendicular to the horizontal axis, wherein the reference time is a time for the pulse signal of the first incident wave or the second incident wave to travel back and forth between a midpoint of the transmission line set and the detector; acquires composite data that composites of the inverted one and another one that is not inverted of the first voltage data and the second voltage data; and detects the strength of the magnetic field based on the composite data.

8. The magnetism detection device according to claim 7, wherein
the transmission line is the only transmission line in the transmission line set,
the first end is an end of the transmission line, the second end is another end of the transmission line opposite to the end of the transmission line, and
the detector:
sweeps a sinusoidal pulse signal as the first incident wave, inputs the first incident wave to the first end, and detects the first reflected wave from the first end;
acquires a first reflectance and a first phase difference of the first reflected wave with respect to the first incident wave for each frequency of the input first incident wave;
acquires, based on the acquired first reflectance of the first reflected wave with respect to the first incident wave, frequency domain data of the first reflectance;
acquires, based on the acquired first phase difference of the first reflected wave with respect to the first incident wave, frequency domain data of the first phase difference;
acquires time domain data of the first reflected wave by inverse Fourier transforming the frequency domain data of the first reflectance and the frequency domain data of the first phase difference;
sweeps a sinusoidal pulse signal as the second incident wave, inputs the second incident wave to the second end, and detects the second reflected wave from the second end;
acquires a second reflectance and a second phase difference of the second reflected wave with respect to the second incident wave for each frequency of the input second incident wave,
acquires, based on the acquired second reflectance of the second reflected wave with respect to the second incident wave, frequency domain data of the second reflectance;
acquires, based on the acquired second phase difference of the second reflected wave with respect to the second incident wave, frequency domain data of the second phase difference; and
acquires time domain data of the second reflected wave by inverse Fourier transforming the frequency domain data of the second reflectance and the frequency domain data of the second phase difference, wherein
the time domain data of the first reflected wave is the first voltage data, and
the time domain data of the second reflected wave is the second voltage data.

9. The magnetism detection device according to claim 8, wherein
the detector:
inverse Fourier transforms the frequency domain data of the first reflectance and the frequency domain data of the first phase difference to acquire a first impulse response as an output of the inverse Fourier transform or integrates the inverse Fourier transformed frequency domain data of the first reflectance and frequency domain data of the first phase difference to acquire a first step response as an output of the integral; and
inverse Fourier transforms the frequency domain data of the second reflectance and the frequency domain data of the second phase difference to acquire a second impulse response as an output of the inverse Fourier transform or integrates the inverse Fourier transformed frequency domain data of the second reflectance and frequency domain data of the second phase difference to acquire a second step response as an output of the integral, the time domain data of the first reflected wave is the first impulse response or the first step response, and the time domain data of the second reflected wave is the second impulse response or the second step response.

10. The magnetism detection device according to claim 1, wherein the transmission line comprises a first transmission line and a second transmission line, the first transmission line and the second transmission line are disposed in parallel, the first end is an end of the first transmission line, and the second end is an end of the second transmission line.

11. The magnetism detection device according to claim 7, wherein the detector:

acquires the first voltage data by subtracting first offset data from data of the first reflected wave; and acquires the second voltage data by subtracting second offset data from data of the second reflected wave, the first offset data is detected when the magnetic field to be detected is not applied to the transmission line set, the data of the first reflected wave is detected when the magnetic field to be detected is applied to the transmission line set, the second offset data is detected when the magnetic field to be detected is not applied to the transmission line set, and the data of the second reflected wave is detected when the magnetic field to be detected is applied to the transmission line set.

12. A magnetism detection method, comprising inputting, from a first end of a transmission line set, a pulse signal as a first incident wave;

detecting, at the first end, a first reflected wave of the first incident wave;

inputting, from a second end opposite to the first end, a pulse signal as a second incident wave;

detecting, at the second end, a second reflected wave; and detecting a strength of a magnetic field applied to the transmission line set based on compositing of the first reflected wave and the second reflected wave, wherein the transmission line set having a transmission line comprising a linear first conductor comprising a magnetic material.

* * * * *